United States Patent
Sato et al.

(10) Patent No.: US 12,040,003 B2
(45) Date of Patent: *Jul. 16, 2024

(54) GLASS FOR MAGNETIC RECORDING MEDIUM SUBSTRATE, MAGNETIC RECORDING MEDIUM SUBSTRATE, MAGNETIC RECORDING MEDIUM AND GLASS SPACER FOR MAGNETIC RECORDING AND REPRODUCING APPARATUS

(71) Applicant: HOYA CORPORATION, Tokyo (JP)

(72) Inventors: Koichi Sato, Tokyo (JP); Kazuaki Hashimoto, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/075,606

(22) Filed: Dec. 6, 2022

(65) Prior Publication Data

US 2023/0103236 A1  Mar. 30, 2023

Related U.S. Application Data

(63) Continuation of application No. 17/357,281, filed on Jun. 24, 2021, now Pat. No. 11,551,714, which is a continuation of application No. 16/349,795, filed as application No. PCT/JP2017/040833 on Nov. 14, 2017, now Pat. No. 11,081,133.

(30) Foreign Application Priority Data

Nov. 14, 2016  (JP) ................................. 2016-221389

(51) Int. Cl.
| | |
|---|---|
| *G11B 5/73* | (2006.01) |
| *C03C 3/085* | (2006.01) |
| *C03C 3/087* | (2006.01) |
| *C03C 3/091* | (2006.01) |
| *C23C 14/16* | (2006.01) |
| *C23C 14/35* | (2006.01) |
| *G11B 5/65* | (2006.01) |

(52) U.S. Cl.
CPC .......... *G11B 5/73921* (2019.05); *C03C 3/085* (2013.01); *C03C 3/087* (2013.01); *C03C 3/091* (2013.01); *C23C 14/16* (2013.01); *C23C 14/35* (2013.01); *G11B 5/658* (2021.05)

(58) Field of Classification Search
None
See application file for complete search history.

(56) References Cited

U.S. PATENT DOCUMENTS

| | | | |
|---|---|---|---|
| 6,426,311 B1 | 7/2002 | Goto et al. | |
| 6,819,526 B2 | 11/2004 | Kataoka et al. | |
| 8,394,516 B2 | 3/2013 | Matsumoto et al. | |
| 8,603,653 B2 | 12/2013 | Matsumoto et al. | |
| 8,652,660 B2 | 2/2014 | Isono et al. | |
| 8,840,997 B2 | 9/2014 | Koyama et al. | |
| 10,717,670 B2 | 7/2020 | Inoue et al. | |
| 11,081,133 B2* | 8/2021 | Sato ...................... G11B 5/658 |
| 11,551,714 B2* | 1/2023 | Sato ...................... G11B 5/658 |
| 11,884,584 B2* | 1/2024 | Sato ...................... C03C 3/091 |
| 2006/0216552 A1 | 9/2006 | Ikenishi et al. | |
| 2011/0123832 A1 | 5/2011 | Matsumoto et al. | |
| 2012/0052275 A1 | 3/2012 | Hashimoto et al. | |
| 2012/0107647 A1 | 5/2012 | Matsumoto et al. | |
| 2012/0188663 A1 | 7/2012 | Isono et al. | |
| 2013/0083425 A1* | 4/2013 | Tamaki ............... G11B 5/8404 |
| 2013/0101798 A1 | 4/2013 | Hashimoto | |
| 2014/0036644 A1* | 2/2014 | Matsumoto ........... C03C 21/002 428/846.9 |
| 2016/0225396 A1 | 8/2016 | Shimojima | |

FOREIGN PATENT DOCUMENTS

| | | |
|---|---|---|
| CN | 1290665 A | 4/2001 |
| CN | 1306946 A | 8/2001 |
| CN | 102471133 A | 5/2012 |
| CN | 103189917 A | 7/2013 |
| CN | 103493133 A | 1/2014 |
| CN | 105517966 A | 4/2016 |

(Continued)

OTHER PUBLICATIONS

Jan. 30, 2018 International Search Report issued in International Patent Application PCT/JP2017/040833.

(Continued)

*Primary Examiner* — Kevin M Bernatz
(74) *Attorney, Agent, or Firm* — Oliff PLC

(57) ABSTRACT

A glass for magnetic recording medium substrate is an amorphous oxide glass. In terms of mol %, $SiO_2$ content ranges from 45 to 68%, $Al_2O_3$ from 5 to 20%, total content of $SiO_2$ and $Al_2O_3$ 60 to 80%, $B_2O_3$ from 0 to 5%, MgO from 3 to 28%, CaO from 0 to 18%, total content of BaO and SrO 0 to 2%, total content of alkali earth metal oxides from 12 to 30%, total content of alkali metal oxides from 3.5 to 15%, and at least one kind selected from the group made of Sn oxide and Ce oxide being included, a total content of Sn oxide and Ce oxide ranges from 0.05 to 2.00%, a glass transition temperature $\geq 625°$ C., a Young's modulus $\geq 83$ GPa, a specific gravity $\leq 2.85$, and an average linear expansion coefficient at 100 to 300° C. $\geq 48 \times 10^{-7}/°$ C.

19 Claims, No Drawings

(56) References Cited

FOREIGN PATENT DOCUMENTS

| | | |
|---|---|---|
| CN | 105518779 A | 4/2016 |
| JP | H11-302033 A | 11/1999 |
| JP | 2001-39732 A | 2/2001 |
| JP | 2001-76336 A | 3/2001 |
| JP | 2001-134925 A | 5/2001 |
| JP | 2001-307452 A | 11/2001 |
| JP | 2010-64921 A | 3/2010 |
| JP | 2013-028512 A | 2/2013 |
| JP | 2015-54794 A | 3/2015 |
| WO | 2001/021539 A1 | 3/2001 |

OTHER PUBLICATIONS

Jan. 30, 2018 Written Opinion issued in International Patent Application PCT/JP2017/040833.
May 14, 2019 International Preliminary Report on Patentability issued in International Patent Application No. PCT/JP2017/040833.
Feb. 25, 2020 Office Action issued in Japanese Patent Application No. 2018-550300.
Jun. 13, 2020 Office Action issued in Singaporean Patent Application No. 11201904331W.

\* cited by examiner

GLASS FOR MAGNETIC RECORDING MEDIUM SUBSTRATE, MAGNETIC RECORDING MEDIUM SUBSTRATE, MAGNETIC RECORDING MEDIUM AND GLASS SPACER FOR MAGNETIC RECORDING AND REPRODUCING APPARATUS

CROSS REFERENCE TO RELATED APPLICATION

This application is a continuation of U.S. application Ser. No. 17/357,281, filed Jun. 24, 2021, now U.S. Pat. No. 11,551,714, which is a continuation of U.S. application Ser. No. 16/349,795, filed May 14, 2019, now U.S. Pat. No. 11,081,133, which is a national stage of PCT/JP2017/040833, filed Nov. 14, 2017, the contents of which are incorporated herein by reference.

TECHNICAL FIELD

The present invention relates to a glass for magnetic recording medium substrate, a magnetic recording medium substrate, a magnetic recording medium, and a glass spacer for magnetic recording and reproducing apparatus.

BACKGROUND ART

Heretofore, a substrate made from an aluminum alloy was used for a substrate for magnetic recording medium such as a hard disk (magnetic recording medium substrate). However, as to a substrate made of an aluminum alloy, drawbacks such as easy deformation, insufficient smoothness of the substrate surface after polishing, and the like have been pointed out. Therefore, nowadays magnetic recording medium substrates made of glass are widely used (for example, see Patent Literature 1).

CITATION LIST

Patent Literature

PTL 1: Japanese Unexamined Patent Publication (KOKAI) No. 2010-64921

SUMMARY OF INVENTION

Technical Problem

In a process of forming a magnetic recording layer on a magnetic recording medium substrate, film formation at a high temperature is usually performed or a heat treatment at a high temperature is performed after film formation. Accordingly, a glass for magnetic recording medium substrate is required to have high heat resistance capable of withstanding a high temperature treatment, specifically to have a high glass transition temperature.

On the other hand, a magnetic recording and reproducing apparatus incorporated with a magnetic recording medium (generally referred to as a HDD (hard disk drive)) has a structure in which the center portion is pressed down with a spindle of a spindle motor and a clamp and the magnetic recording medium itself is rotated. As a consequence, when there is a large difference between respective thermal expansion coefficients of a magnetic recording medium substrate and a spindle material constituting the spindle portion, deviation occurs during use between thermal expansion/thermal contraction of the spindle and thermal expansion/thermal contraction of the magnetic recording medium substrate relative to ambient temperature change. As a result, a phenomenon such as deformation of the magnetic recording medium is generated. When the phenomenon is generated, a head cannot read written information to cause deterioration of reliability on recording/reproduction. Accordingly, a glass for magnetic recording medium substrate is required to have a suitable thermal expansion coefficient at approximately the same level as that of a spindle material (such as stainless steel).

Furthermore, along with reduction in plate thickness of a magnetic recording medium and increase in recording density, there are also increasing requests to further reduction in warpage and deflection of a magnetic recording medium during rotation of a spindle motor, and to practical strength of a magnetic recording medium. In order to respond to these requests, a glass for magnetic recording medium substrate desirably has high rigidity, specifically has a high Young's modulus.

In addition, a glass for magnetic recording medium substrate desirably has a low specific gravity. This is because weight of a magnetic recording medium substrate can be reduced by a low specific gravity. Weight reduction of a substrate leads to weight reduction of a magnetic recording medium, which can decrease an electric power necessary for rotating the magnetic recording medium to thereby suppress power consumption of a HDD.

Furthermore, a glass for magnetic recording medium substrate is also desired to have excellent glass stability. Here, the glass stability means a lower precipitation level of crystals in a molten-state glass, which can be evaluated by, for example, the presence or absence of or degree of crystal precipitation after holding a molten-state glass for a long period of time at a holding temperature near liquidus temperature. In addition, it can be said that a glass is more excellent in stability as crystals are less likely to precipitate even when a holding temperature is more lowered. Glasses excellent in glass stability can be molded at a lower molding temperature and thus are capable of lengthening the lifespan of a heat generator, a furnace body, pipes and the like that are constituent members of a molding apparatus. Furthermore, in order to suppress the generation of volatilization, stria and molding foam, desirably molding is performed under a raised glass viscosity by lowering a molding temperature. However, in glasses with poor glass stability, crystals are precipitated when a molding temperature is lowered. In contrast, glasses that are excellent in glass stability would be able to lower molding temperatures while suppressing precipitation of crystals.

As described above, it is desirable for a glass for magnetic recording medium substrate to have excellent heat resistance, rigidity and glass stability, and has a low specific gravity and suitable thermal expansion coefficient.

Thus, an aspect of the present invention aims at providing a glass for magnetic recording medium substrate excellent in heat resistance, rigidity and glass stability, and having a low specific gravity and suitable thermal expansion coefficient.

Solution to Problem

An aspect of the present invention relates to a glass for magnetic recording medium substrate, which is an amorphous oxide glass, wherein, in terms of mol %:
an $SiO_2$ content ranges from 45 to 68%;
an $Al_2O_3$ content ranges from 5 to 20%;

a total content of $SiO_2$ and $Al_2O_3$ ($SiO_2+Al_2O_3$) ranges from 60 to 80%;
a $B_2O_3$ content ranges from 0 to 5%;
an MgO content ranges from 3 to 28%;
a CaO content ranges from 0 to 18%;
a total content of BaO and SrO (BaO+SrO) ranges from 0 to 2%;
a total content of alkali earth metal oxides (MgO+CaO+SrO+BaO) ranges from 12 to 30%;
a total content of alkali metal oxides ($Li_2O+Na_2O+K_2O$) ranges from 3.5 to 15%; and
at least one kind selected from the group consisting of Sn oxide and Ce oxide being included, a total content of Sn oxide and Ce oxide ranges from 0.05 to 2.00%,
a glass transition temperature is equal to or higher than 625° C.;
a Young's modulus is equal to or more than 83 GPa;
a specific gravity is equal to or less than 2.85; and
an average linear expansion coefficient at 100 to 300° C. is equal to or more than $48 \times 10^{-7}$/° C.

The above glass for magnetic recording medium substrate can have, as a consequence of having the above glass composition, high heat resistance such that the glass transition temperature is equal to or higher than 625° C., high rigidity such that the Young's modulus is equal to or more than 83 G, a specific gravity equal to or less than 2.85, and the above suitable thermal expansion coefficient, and can exhibit excellent glass stability.

Effects of Invention

According to an aspect of the present invention, a glass for magnetic recording medium substrate, which is excellent in heat resistance and rigidity, has a low specific gravity and a suitable thermal expansion coefficient and is excellent in glass stability, can be provided. Furthermore, according to an aspect, a magnetic recording medium substrate comprised of the above glass for magnetic recording medium substrate, and a magnetic recording medium containing the above substrate can also be provided. In addition, according to an aspect, a glass spacer for magnetic recording apparatus can be provided.

DESCRIPTION OF EMBODIMENTS

[Glass for Magnetic Recording Medium Substrate]

An aspect of the present invention relates to a glass for magnetic recording medium substrate which is an amorphous oxide glass (hereinafter, also simply referred to as "glass"), which has the above glass composition, a glass transition temperature of equal to or higher than 625° C., a Young's modulus of equal to or more than 83 GPa, a specific gravity of equal to or less than 2.85, and an average linear expansion coefficient at 100 to 300° C. is equal to or more than $48 \times 10^{-7}$/° C.

The above glass is an amorphous glass, and an oxide glass. Unlike a crystallized glass, an amorphous glass is a glass that does not contain a crystal phase and exhibits a glass transition phenomenon by temperature rising. An oxide glass is a glass in which a main network-forming component is an oxide.

Hereinafter, the above glass will be explained in more detail.

<Glass Composition>

In the present invention and in the present description, a glass composition is denoted by a glass composition based on oxides. Here, a "glass composition based on oxides" means a glass composition obtained by performing conversion such that all glass raw materials are decomposed in melting and are present as oxides in the glass. The glass composition is denoted on the basis of mole (mol %, molar ratio), unless otherwise specified.

The glass composition in the present invention and present description can be obtained by, for example, a method such as ICP-AES (Inductively Coupled Plasma-Atomic Emission Spectrometry). ICP-AES is used for quantitative analysis, and the analysis is performed for each of elements. Subsequently, analysis values are converted into expressions based on oxides. Analysis values by means of ICP-AES may include, for example, a measurement error of approximately ±5% of an analysis value. Accordingly, a value based on oxide expression converted from an analysis value may also include an error of approximately ±5%.

Moreover, in the present invention and present description, the fact that a constituent component is 0% in content, or is not contained or not introduced denotes that the constituent component is substantially not contained, and that the content of the constituent component is at approximately equal to or less than a level of impurities. "Approximately equal to or less than a level of impurities" means, for example, less than 0.01%.

Hereinafter, the glass composition of the above glass will be explained.

$SiO_2$ is a network-forming component in glasses, and serves for improving glass stability. Moreover, $SiO_2$ is a component that also contributes to improving chemical durability. The content of $SiO_2$ in the above glass is, from the viewpoint of improving a thermal expansion coefficient and of maintaining meltability and moldability, equal to or less than 68%, preferably equal to or less than 65%, more preferably equal to or less than 64%, still more preferably equal to or less than 63%, and further preferably equal to or less than 62%. Moreover, the content of $SiO_2$ in the above glass is, from the viewpoint of maintaining heat resistance and chemical durability, equal to or more than 45%, preferably equal to or more than 48%, more preferably equal to or more than 50%, still more preferably equal to or more than 52%, further preferably equal to or more than 53%, and still further preferably equal to or more than 54%.

$Al_2O_3$ is also a network-forming component in glasses, and serves for improving heat resistance. $Al_2O_3$ also serves for improving chemical durability. The content of $Al_2O_3$ in the above glass is, from the viewpoint of improving heat resistance and chemical durability, equal to or more than 5%, preferably equal to or more than 8%, more preferably equal to or more than 10%, still more preferably equal to or more than 12%, and further preferably equal to or more than 13%. Furthermore, the content of $Al_2O_3$ in the above glass is, from the view point of improving glass stability, equal to or less than 20%, preferably equal to or less than 18%, more preferably equal to or less than 17%, and still more preferably equal to or less than 16%.

Each content of $SiO_2$ and $Al_2O_3$ is as described above. Furthermore, the total content of $SiO_2$ and $Al_2O_3$ ($SiO_2+Al_2O_3$) in the above glass is, from the viewpoint of stabilizing a glass structure, equal to or more than 60%, more preferably equal to or more than 65%, still more preferably equal to or more than 67%, further preferably equal to or more than 69%, and still further preferably equal to or more than 70%. Moreover, from the viewpoint of viscosity properties in melting, the total content of $SiO_2$ and $Al_2O_3$ ($SiO_2+Al_2O_3$) in the above glass is equal to or less than 80%, preferably equal to or less than 78%, more preferably equal to or less than 77%, still more preferably equal to or less than 76%, and further preferably equal to or less than 75%.

$B_2O_3$ is also a network-forming component in glasses, is a component for reducing the specific gravity of glass, and is also a component for improving meltability. However, $B_2O_3$ easily volatilizes in melting to thereby easily make a glass component ratio unstable. Moreover, excessive introduction thereof tends to lower chemical durability. From the above, the content of $B_2O_3$ in the above glass is set to 0 to 5%. The content of $B_2O_3$ is preferably equal to or less than 3%, more preferably equal to or less than 2%, still more preferably equal to or less than 1%, further preferably equal to or less than 0.5%, and still further preferably equal to or less than 0.3%.

Among MgO, CaO, SrO and BaO which are alkali earth metal oxides, MgO serves for enhancing a Young's modulus and a specific elastic modulus of glass, for increasing a thermal expansion coefficient, and for improving meltability and/or moldability of glass. Details of a specific elastic modulus will be described later. From the viewpoint of obtaining good these functions, the content of MgO in the above glass is equal to or more than 3%, preferably equal to or more than 5%, more preferably equal to or more than 6%, still more preferably equal to or more than 7%, and further preferably equal to or more than 8%. Moreover, from the viewpoint of maintaining chemical durability, the content of MgO in the above glass is equal to or less than 28%, preferably equal to or less than 26%, more preferably equal to or less than 23%, still more preferably equal to or less than 20%, further preferably equal to or less than 17%, and still further preferably equal to or less than 15%.

The content of CaO in the above glass is equal to or more than 0%. CaO also serves for enhancing a Young's modulus and a specific elastic modulus of glass, for increasing a thermal expansion coefficient, and for improving the meltability and/or moldability of glass. From the viewpoint of obtaining good these functions, the content of CaO in the above glass is preferably equal to or more than 1%, more preferably equal to or more than 2%, still more preferably equal to or more than 3%, further preferably equal to or more than 4%, and still further preferably equal to or more than 5%. Moreover, from the viewpoint of maintaining chemical durability, the content of CaO in the above glass is equal to or less than 18%, preferably equal to or less than 15%, more preferably equal to or less than 13%, and still more preferably equal to or less than 12%.

SrO serves for improving meltability and moldability of glass and glass stability, and serves for increasing a thermal expansion coefficient. From the viewpoint of maintaining chemical durability, reducing a specific gravity and reducing raw material cost, the content of SrO in the above glass ranges preferably from 0 to 2%. The content of SrO ranges more preferably from 0 to 1%, and still more preferably from 0 to 0.5%. Most preferably SrO is not contained, namely, the content of SrO is 0%.

Each of BaO and SrO is a component that raises a specific gravity of glass. From the viewpoint of reducing a specific gravity of glass, the total content of BaO and SrO (BaO+SrO) in the above glass ranges from 0 to 2%, preferably from 0 to 1%, and still more preferably from 0 to 0.5%. Most preferably BaO and SrO are not contained, namely, the total content of BaO and SrO (BaO+SrO) is 0%.

BaO also serves for improving meltability, moldability and glass stability of glass, and serves for increasing a thermal expansion coefficient. From the viewpoint of maintaining chemical durability, and reducing specific gravity and raw material cost, the content of BaO in the above glass ranges preferably from 0 to 2%, more preferably from 0 to 1%, and still more preferably from 0 to 0.5%. Most preferably BaO is not contained, that is, the content of BaO is 0%.

From the viewpoint of meltability and stability of glass, the total content of alkali earth metal oxides (MgO+CaO+SrO+BaO) in the above glass is equal to or more than 12%, preferably equal to or more than 14%, more preferably equal to or more than 15%, and still more preferably equal to or more than 16%. Moreover, from the viewpoint of chemical durability of glass, the total content of alkali earth metal oxides (MgO+CaO+SrO+BaO) in the above glass is equal to or less than 30%, preferably equal to or less than 28%, more preferably equal to or less than 26%, and still more preferably equal to or less than 25%.

Among alkali earth metal oxides, MgO is a component that serves for enhancing a Young's modulus and a specific elastic modulus of glass, and is also a component that contributes to suppressing increase in a specific gravity. Accordingly, MgO is a very useful component for raising a Young's modulus and a specific elastic modulus and for reducing a specific gravity of glass, and is effective particularly for raising a Young's modulus and reducing a specific gravity. CaO is also a component that serves for raising a Young's modulus and a specific elastic modulus of glass and that contributes to suppressing the increase in a specific gravity, and that is a component effective for increasing a thermal expansion coefficient of glass. On the other hand, SrO and BaO increase a specific gravity and raw material cost. From the viewpoint of the above, a molar ratio of the total content of MgO and CaO relative to the total content of alkali earth metal oxides {(MgO+CaO)/(MgO+CaO+SrO+BaO)} in the above glass ranges preferably from 0.75 to 1.00. The lower limit of the molar ratio is more preferably equal to or more than 0.80, still more preferably equal to or more than 0.85, further preferably equal to or more than 0.90, and still further preferably equal to or more than 0.95.

$Li_2O$ is a component, among alkali metal oxides, that strongly serves for improving meltability and moldability of glass, and that is suitable for increasing a Young's modulus to thereby impart suitable rigidity to a magnetic recording medium substrate. $Li_2O$ is also a component that increases a thermal expansion coefficient. Moreover, in a case where the above glass is to be used as a glass for chemical strengthening, $Li_2O$ is also a component that bears ion exchange in chemical strengthening. On the other hand, $Li_2O$ is also a component that lowers a glass transition temperature. In consideration of the above functions, the content of $Li_2O$ in the above glass ranges preferably from 0 to 10%. The lower limit of the content of $Li_2O$ is more preferably equal to or more than 0.5%, still more preferably equal to or more than 1.0%, and further preferably equal to or more than 2.0%. The upper limit of the content of $Li_2O$ is more preferably equal to or less than 8%, still more preferably equal to or less than 7%, and further more preferably equal to or less than 6%.

$Na_2O$ is a component that serves for improving meltability and moldability of glass, increasing a thermal expansion coefficient and reducing viscosity of glass in clarifying to thereby promote bubble separation. Moreover, in a case where the above glass is to be used as a glass for chemical strengthening, $Na_2O$ is also a component that bears ion exchange in chemical strengthening. In consideration of the above functions, the content of $Na_2O$ in the above glass ranges preferably from 0 to 10%. The lower limit of the content of $Na_2O$ is more preferably equal to or more than 0.5%, still more preferably equal to or more than 1.0%, and further preferably equal to or more than 2.0%. The upper limit of the content of $Na_2O$ is more preferably equal to or less than 8%, still more preferably equal to or less than 7%, and further preferably equal to or less than 6%.

$K_2O$ is also a component that serves for improving meltability and moldability of glass, and that increases a thermal expansion coefficient. However, excessive introduction thereof may deteriorate chemical durability, particularly acid resistance, and that, when the glass is used as a glass substrate, alkali elution from the substrate surface may increase and precipitated alkali may influence film properties of magnetic recording layer and the like. In consideration of the above point, the content of $K_2O$ in the above glass ranges preferably from 0 to 5%, more preferably from 0 to 3%, still more preferably from 0 to 2%, and further preferably from 0 to 1%. Most preferably $K_2O$ is not contained.

$Li_2O$, $Na_2O$ and $K_2O$ are components, as described above, that improve meltability and moldability of glass and increase a thermal expansion coefficient. From the viewpoint of obtaining good functions of these components, the total content of alkali metal oxides ($Li_2O+Na_2O+K_2O$) in the above glass is equal to or more than 3.5%, and more preferably equal to or more than 4%. On the other hand, from the viewpoint of maintaining heat resistance and chemical durability of glass, the total content of alkali metal oxides ($Li_2O+Na_2O+K_2O$) in the above glass is equal to or less than 15%, preferably equal to or less than 13%, more preferably equal to or less than 12%, and still more preferably equal to or less than 11%. As a consequence of the fact that glass contains equal to or more than two kinds of alkali metal oxides, a reduction or prevention effect of alkali elution from the glass surface can be obtained by a mixed alkali effect.

$Li_2O$ is a component, among alkali metal oxides, that increases a Young's modulus of glass and more effectively contributes to increasing a thermal expansion coefficient. Consequently, in an embodiment, from the viewpoint of increasing a Young's modulus and/or improving a thermal expansion coefficient, a molar ratio of $Li_2O$ content relative to the total content of alkali metal oxides $\{Li_2O/(Li_2O+Na_2O+K_2O)\}$ ranges preferably from 0.4 to 1. In an embodiment of the above glass whose molar ratio $\{Li_2O/(Li_2O+Na_2O+K_2O)\}$ is within the above range, a Young's modulus equal to or more than 90 GPa can be obtained. In an embodiment, the lower limit of the molar ratio $\{Li_2O/(Li_2O+Na_2O+K_2O)\}$ is more preferably equal to or more than 0.5, still more preferably equal to or more than 0.6, further preferably equal to or more than 0.7, and still further preferably equal to or more than 0.8.

$Na_2O$ is a component, among alkali metal oxides, that improves meltability and moldability of glass and that more effectively contributes to increasing a thermal expansion coefficient. Furthermore, $Na_2O$ has smaller influence on a drop in glass transition temperature, than $Li_2O$. Consequently, in an embodiment, from the viewpoint of improving heat resistance and/or improving a thermal expansion rate, the molar ratio of $Na_2O$ content relative to the total content of alkali metal oxides $\{Na_2O/(Li_2O+Na_2O+K_2O)\}$ ranges preferably from 0.4 to 1. In an embodiment of the above glass whose molar ratio of $\{Na_2O/(Li_2O+Na_2O+K_2O)\}$ is within the above range, a glass transition temperature of equal to or more than 690° C. can be set. In an embodiment, the lower limit of the molar ratio of $\{Na_2O/(Li_2O+Na_2O+K_2O)\}$ is more preferably equal to or more than 0.5, still more preferably equal to or more than 0.6, further preferably equal to or more than 0.7, and still further preferably equal to or more than 0.8.

$TiO_2$ serves for improving glass stability and/or chemical durability and enhancing a Young's modulus, but excessive introduction thereof may raise liquidus temperature of glass to thereby cause deterioration of devitrification resistance and/or rise of a specific gravity. Accordingly, the content of $TiO_2$ in the above glass ranges preferably from 0 to 8%, more preferably from 0 to 6%, still more preferably from 0 to 5%, further preferably from 0 to 4%, still further preferably from 0 to 3%, and still further more preferably from 0 to 2%.

$HfO_2$, $Nb_2O_5$, $Ta_2O_5$, $La_2O_3$ and $Y_2O_3$ serve for improving chemical durability, particularly alkali resistance. However, excessive introduction thereof may deteriorate meltability and increase a specific gravity. Accordingly, from the viewpoint of improving chemical durability, particularly alkali resistance while maintaining meltability, the total content of $HfO_2$, $Nb_2O_5$, $Ta_2O_5$, $La_2O_3$ and $Y_2O_3$ ($HfO_2+Nb_2O_5+Ta_2O_5+La_2O_3+Y_2O_3$) ranges preferably from 0 to 5%. The lower limit thereof is preferably equal to or more than 0.3%, more preferably equal to or more than 0.5%, and still more preferably equal to or more than 1.0%. The upper limit thereof is preferably equal to or less than 5%, more preferably equal to or less than 3%, and still more preferably equal to or less than 2%.

$ZrO_2$ serves for improving chemical durability, and also serves for enhancing a Young's modulus. However, excessive introduction thereof may lower meltability of glass to thereby generate residue of raw material melting. Accordingly, the content of $ZrO_2$ in the above glass ranges preferably from 0 to 5%, more preferably from 0 to 3%, still more preferably from 0 to 2%, and further preferably from 0 to 1%.

ZnO serves for improving meltability and enhancing a Young's modulus, but excessive introduction thereof raises a liquidus temperature. Therefore, the content of ZnO in the above glass ranges preferably from 0 to 3%. The content of ZnO ranges more preferably from 0 to 2%, still more preferably from 0 to 1%, and the content may be 0%.

$P_2O_5$ can be introduced in a small quantity, but excessive introduction thereof tends to lower chemical durability. Therefore, the content of $P_2O_5$ in the above glass ranges preferably from 0 to 2%. The content of $P_2O_5$ ranges more preferably from 0 to 1%. Still more preferably $P_2O_5$ is not contained, namely, the content of $P_2O_5$ is 0%.

The above glass contains, from the viewpoint of obtaining a clarification effect, at least one kind selected from the group consisting of Sn oxide and Ce oxide, and the total content of Sn oxide and Ce oxide ranges from 0.05% to 2.00%. As a consequence of the fact that the total content of Sn oxide and Ce oxide is equal to or more than 0.05%, a sufficient clarification effect can be obtained, and residual bubbles can be reduced or suppressed. Furthermore, as a consequence of the fact that the above total content is equal to or less than 2.00%, during melting of glass, lowering of productivity by the blow-up of molten glass can be prevented. The lower limit of the total content of Sn oxide and Ce oxide is preferably equal to or more than 0.10%, more preferably equal to or more than 0.15%, and still more preferably equal to or more than 0.20%. The upper limit of the total content of Sn oxide and Ce oxide is preferably equal to or less than 1.50%, more preferably equal to or less than 1.20%, and still more preferably equal to or less than 1.00%.

Sn oxide serves for promoting clarification in a state where melting temperature of glass is comparatively high (temperature region of approximately 1400 to 1600° C.). In a circumstance where use of a clarifying agent such as $Sb_2O_3$ and arsenious acid adversely affecting the environment is limited, introduction of Sn oxide (for example, $SnO_2$) into the above glass is preferable for removing bubbles in glass having a high glass transition temperature. The content of Sn oxide is, from the viewpoint of obtaining a clarification effect, preferably equal to or more than 0.01%, more preferably equal to or more than 0.05%, still more preferably equal to or more than 0.10%, further preferably equal to or more than 0.15%, and still further preferably equal to or more than 0.20%. Moreover, the content of Sn oxide is preferably equal to or less than 2.00%, more preferably equal to or less than 1.50%, still more preferably equal to or less than 1.00%, and further preferably equal to or less than 0.80%.

Ce oxide is a component that exhibits a clarification action of glass as is the case for Sn oxide. Ce oxide serves for taking in oxygen and fixing it as a glass component in a state where melting temperature of glass is comparatively low (temperature region approximately from 1200 to 1400° C.), and preferably Ce oxide (for example, $CeO_2$) is introduced into the glass as a clarifying agent. The content of Ce oxide is, from the viewpoint of obtaining a clarification effect, preferably equal to or more than 0.01%, more preferably equal to or more than 0.05%, still more preferably equal to or more than 0.10%, and further preferably equal to or more than 0.20%. Moreover, the content of Ce oxide is preferably equal to or less than 1.00%, more preferably equal to or less than 0.80%, still more preferably equal to or less than 0.50%, and further preferably equal to or less than 0.40%.

The above glass contains at least one kind selected from the group consisting of Sn oxide and Ce oxide. Among Sn oxide and Ce oxide, the glass contains only Sn oxide in an embodiment, contains only Ce oxide in another embodiment, and contains both Sn oxide and Ce oxide in still another embodiment. In particular, as a consequence of allowing Sn oxide and Ce oxide to coexist in the above glass, a clarification action in a wide temperature region can be obtained, and thus the above glass preferably contains both Sn oxide and Ce oxide.

It is desirable to refrain from using $Sb_2O_3$ which has been broadly used as a clarifying agent, from the viewpoint of reducing environmental loads. Consequently, the content of $Sb_2O_3$ in the above glass ranges preferably from 0 to 0.5%. The content of $Sb_2O_3$ is more preferably equal to or less than 0.2%, still more preferably equal to or less than 0.1%, further preferably equal to or less than 0.05%, and still further preferably equal to or less than 0.02%. Particularly preferably $Sb_2O_3$ is not contained.

The above glass can contain Fe in an amount approximately equal to or less than 0.5% in terms of $Fe_2O_3$. The content of Fe is, in terms of $Fe_2O_3$, preferably equal to or less than 0.2%, more preferably equal to or less than 0.1%, and still more preferably equal to or less than 0.05%. Further preferably Fe is not contained.

Pb, Cd, As and the like are materials that adversely affect environment, and thus preferably introduction of these is avoided.

The above glass can be produced by weighing and compounding glass raw materials such as oxides, carbonates, nitrates, sulfates and hydroxides so as to give a predetermined glass composition, by sufficiently mixing these materials, heating and melting the mixture within a range of, for example, 1400 to 1600° C. in a melting vessel, and by molding homogenized molten glass that has been subjected to clarification and stirring to cause sufficient bubble separation. For example, it is preferable to heat and melt glass raw materials in a melting tank at 1400 to 1550° C., to raise temperature of the obtained molten glass in a clarification tank and hold the glass at 1450 to 1600° C., and after that to lower the temperature and cause glass to flow out at 1200 to 1400° C. to be molded.

<Glass Properties>

As a consequence of performing above composition adjustment, the above glass can have various glass properties described below.

(Glass Transition Temperature)

As described above, usually, magnetic recording medium substrates are subjected to a high temperature treatment in a process for forming a magnetic recording layer on a substrate. For example, in order to form a magnetic recording layer containing a magnetic material with high magnetic anisotropy energy, which is developed recently for high-density recording of a magnetic recording medium, usually, film formation is performed at high temperatures or a heat treatment is performed at high temperatures after film formation. If a magnetic recording medium substrate does not have heat resistance capable of withstanding such high temperature treatment, flatness of the substrate exposed to high temperatures in a high temperature treatment is impaired. In contrast, the above glass has a glass transition temperature (hereinafter, also referred to as "Tg"), which is an indicator related to heat resistance, is equal to or higher than 625° C. A substrate comprised of a glass having high heat resistance such that the glass transition temperature is equal to or higher than 625° C. would be able to keep excellent flatness even after a high temperature treatment. However, the above glass is not limited to a glass for substrate of a magnetic recording medium having a magnetic recording layer containing a magnetic material that needs a high temperature treatment, and the glass can be used for producing magnetic recording media provided with various magnetic materials. A glass transition temperature is preferably equal to or higher than 630° C., more preferably equal to or higher than 640° C., still more preferably equal to or higher than 650° C., further preferably equal to or higher than 660° C., still further preferably equal to or higher than 670° C., further more preferably equal to or higher than 675° C., and still further more preferably equal to or higher than 680° C. The upper limit of a glass transition temperature is, for example, approximately 770° C. However, a higher glass transition temperature is more preferable from the viewpoint of heat resistance, and thus the upper limit is not particularly limited.

(Young's Modulus)

In order to cope with the demands for rigidity improvement of a magnetic recording medium described above, a glass for magnetic recording medium substrate desirably has high rigidity. With respect to this point, the above glass has a Young's modulus, which is an indicator of rigidity, equal to or more than 83 G. According to a glass for magnetic recording medium substrate having high rigidity represented by a Young's modulus equal to or more than 83 G, deformation of a substrate during rotation of a spindle motor can be suppressed, and thus warpage and deflection of a magnetic recording medium, along with deformation of the substrate, can also be suppressed. The Young's modulus of the above glass is preferably equal to or more than 85 GPa, more preferably equal to or more than 86 GPa, still more preferably equal to or more than 88 GPa, and further preferably equal to or more than 90 GPa. The upper limit of the Young's modulus is, for example, approximately 120 GPa. However, a higher Young's modulus means higher rigidity, which is more preferable, and thus the upper limit is not particularly limited.

(Specific Gravity)

Specific gravity of the above glass is equal to or less than 2.85, preferably equal to or less than 2.80, more preferably equal to or less than 2.75, still more preferably equal to or less than 2.70, and further preferably equal to or less than 2.65. As a consequence of reduction in specific gravity of a glass for magnetic recording medium substrate, weight of a magnetic recording medium substrate and furthermore weight of a magnetic recording medium can be reduced, and consequently suppression of power consumption of a HDD becomes possible. The lower limit of the specific gravity is, for example, approximately 2.40. However, a lower specific gravity is more preferable. Therefore, the lower limit is not particularly limited.

(Specific Elastic Modulus)

A specific elastic modulus is obtained by dividing a Young's modulus of glass by density thereof. Here, density can be considered as a value obtained by giving a unit of g/cm$^3$ to a specific gravity of glass. From the viewpoint of providing a substrate that is less likely to be deformed, a specific elastic modulus of the above glass is preferably equal to or more than 31 MNm/kg, more preferably equal to or more than 33 MNm/kg, and still more preferably equal to or more than 34 MNm/kg. The upper limit of a specific elastic modulus is, for example, approximately 40 MNm/kg. However, a higher specific elastic modulus is more preferable. Therefore, the upper limit is not particularly limited.

(Thermal Expansion Coefficient)

From the viewpoint of improving reliability of a magnetic recording medium, as described above, a glass for magnetic recording medium substrate desirably has a suitable thermal expansion coefficient. Generally, a spindle material for HDDs has an average linear expansion coefficient (thermal expansion coefficient) equal to or more than $70 \times 10^{-7}$/° C. within a temperature range of 100 to 300° C., and in a case where an average linear expansion coefficient at 100 to 300° C. of a glass for magnetic recording medium substrate is equal to or more than $48 \times 10^{-7}$/° C., the difference between a thermal expansion coefficient of a glass and that of a spindle material is small, and thus a glass for magnetic recording medium substrate can contribute to improving reliability of a magnetic recording medium. The average linear expansion coefficient (hereinafter, also referred to as "a") of the above glass at 100 to 300° C. is equal to or more than $48 \times 10^{-7}$/° C., more preferably equal to or more than $50 \times 10^{-7}$/° C., and still more preferably equal to or more than $51 \times 10^{-7}$/° C. The average linear expansion coefficient (a) of the above glass at 100 to 300° C. is preferably equal to or less than $90 \times 10^{-7}$/° C.

(Glass Stability)

The above glass can exhibit high glass stability. Evaluation methods for glass stability can include a 1300° C. and 16 hour holding test as well as 1250° C. and 16 hour holding test, which will be described later in detail. Preferably evaluation result A is given in a 1300° C. and 16 hour holding test, more preferably evaluation result A is given in a 1300° C. and 16 hour holding test as well as evaluation result A or B is given in a 1250° C. and 16 hour holding test, and still more preferably evaluation result A is given in both of the holding tests.

(Bubble Density)

In the above glass, reduction in bubbles is also possible by aforementioned composition adjustment. With respect of bubbles in glass, in terms of density of bubbles each having a diameter exceeding 0.03 mm when observation is performed with an optical microscope (magnifications from 40 to 100), bubble density per unit mass is preferably less than 50/kg, more preferably less than 20/kg, still more preferably less than 10/kg, further preferably equal to or less than 2/kg, and most preferably 0/kg.

[Magnetic Recording Medium Substrate]

A magnetic recording medium substrate according to an aspect of the present invention is comprised of the above glass for magnetic recording medium substrate.

Magnetic recording medium substrates can be manufactured through processes of heating glass raw materials to thereby prepare molten glass, of molding the molten glass into a plate shape by one of a press molding method, down-draw method and float method, and of processing the obtained plate-shaped glass. For example, in a press molding method, molten glass flowing out from a glass outflow pipe is cut to a predetermined volume to give an intended molten glass lump, which is press-molded with a press molding die to thereby produce a thin-walled disk-like substrate blank. Subsequently, the obtained substrate blank is given a center hole, and subjected to outer/inner circumference processing, wrapping and polishing for both main surfaces. Subsequently, through cleaning processes including acid cleaning and alkali cleaning, a disk-shaped substrate can be obtained.

In the above magnetic recording medium substrate, in an embodiment, the surface composition and internal composition thereof are homogeneous. Here, "the surface composition and internal composition thereof are homogeneous" means that no ion exchange has been performed (that is, an ion-exchange layer is not contained). For example, in a case where a HDD (hard disk drive) with a built-in magnetic recording medium is used under circumstances that hardly receive impact from the outside, and the like, a magnetic recording medium substrate having no ion-exchange layer can be used. A magnetic recording medium substrate having no ion-exchange layer has not been subjected to an ion exchange treatment, and thus manufacturing cost can be drastically reduced.

In an embodiment, the above magnetic recording medium substrate has an ion-exchange layer on a part of or on the whole of the surface. An ion-exchange layer exhibits compression stress, and thus the presence or absence of an ion-exchange layer can be confirmed by fracturing the substrate perpendicularly to a main surface and obtaining a stress profile by the Babinet method in the fracture surface. A "main surface" is a surface of a substrate on which a magnetic recording layer is to be provided or has been provided. This surface is a surface having the largest area among surfaces of a magnetic recording medium substrate, and thus is referred to as a main surface. In a case of a disk-shaped magnetic recording medium, the main surface corresponds to a circular surface (if there is a center hole, the center hole is excluded) of the disk. The presence or absence of an ion-exchange layer can be confirmed also by a method or the like of measuring concentration distribution of alkali metal ions in the depth direction from the substrate surface.

An ion-exchange layer can be formed by bring an alkali salt into contact with a substrate surface under high temperatures and exchanging an alkali metal ion in the alkali salt for an alkali metal ion in the substrate. Known techniques can be applied to ion exchange (also referred to as a "strengthening treatment" or "chemical strengthening"), and as an example, paragraphs 0068 to 0069 of WO 2011/019010A1 can be referred to.

For example, a thickness of the above magnetic recording medium substrate is equal to or less than 1.5 mm, preferably equal to or less than 1.2 mm, and more preferably equal to or less than 1 mm. The lower limit of the thickness is preferably 0.3 mm. Furthermore, the above magnetic recording medium substrate has preferably a disk shape having a center hole.

The above magnetic recording medium substrate is comprised of amorphous glass. Amorphous glass can have excellent surface smoothness when it is processed into a substrate, as compared with crystallized glass.

[Magnetic Recording Medium]

An aspect of the present invention relates to a magnetic recording medium having a magnetic recording layer on the above magnetic recording medium substrate.

A magnetic recording medium is referred to as a magnetic disk, hard disk, or the like, and is suitable for various magnetic recording and reproducing apparatuses, such as: internal memories (such as fixed disk) for desktop personal computers, computers for server, notebook computers and mobile personal computers; internal memories for portable recording and reproducing apparatuses for recording and reproducing images and/or voices; and recording and reproducing devices for in-vehicle audio devices. In the present invention and present description, a "magnetic recording and reproducing apparatus" means an apparatus capable of performing one of or both of magnetic recording of information and magnetic reproduction of information.

A magnetic recording medium has a configuration in which, for example, at least an adhesive layer, an undercoat layer, a magnetic layer (magnetic recording layer), a protective layer, and a lubricating layer are stacked, in this order from a main surface, on the main surface of a magnetic recording medium substrate.

For example, a magnetic recording medium substrate is introduced into an evacuated film formation apparatus, and sequential film formation from the adhesive layer to the magnetic layer is performed over the main surface of a magnetic recording medium substrate by a DC (Direct Current) magnetron sputtering process in an Ar atmosphere. For example, CrTi can be used for the adhesive layer, and for example, CrRu can be used for the undercoat layer. After the above film formation, for example, by a CVD (Chemical Vapor Deposition) process, the protective layer is formed using $C_2H_4$, which is subjected to a nitriding treatment of introducing nitrogen to the surface in the same chamber to thereby be able to form a magnetic recording medium. After that, for example, applying PFPE (polyfluoropolyether) onto the protective layer by a dip coat method makes it possible to form the lubricating layer.

In order to achieve further higher density recording of a magnetic recording medium, a magnetic recording layer preferably contains a magnetic material with high magnetic anisotropy energy. Magnetic materials preferable from this viewpoint can include Fe—Pt-based magnetic materials and Co—Pt-based magnetic materials. Here, "-based" means inclusion. Namely, the above magnetic recording medium preferably has a magnetic recording layer containing Fe and Pt, or Co and Pt, as the magnetic recording layer. With respect to a magnetic recording layer containing these magnetic materials and to a film formation process thereof, descriptions in WO 2011/019010A1, paragraph 0074 and Examples in this publication can be referred to. Furthermore, a magnetic recording medium having such a magnetic recording layer is preferably applied to a magnetic recording apparatus by a recording system referred to as an energy-assisted recording system. Among energy-assisted recording systems, a recording system in which magnetization reversal is assisted by irradiation with laser light or the like is referred to as a heat-assisted recording system, and a recording system in which magnetization reversal is assisted by microwaves is referred to as a microwave-assisted recording system. With respect to details of these, WO 2011/019010A1, paragraph 0075 can be referred to.

Recently, the significant reduction in a gap between a recording and reproducing element portion of a magnetic head and a surface of a magnetic recording medium (low floating amount) is achieved by mounting a DFH (Dynamic Flying Height) mechanism on a magnetic head, and thereby the achievement of further higher recording density is realized. The DFH mechanism is a function that causes only periphery of the element portion to project in the medium surface direction, by providing a heating portion such as a micro heater near a recording and reproducing element portion of a magnetic head. Consequently, distance (flying height) between the magnetic head and the magnetic recording layer of a medium becomes smaller, and thus it becomes possible to pick out signals from smaller magnetic particles and to achieve further higher recording density. On the other hand, however, the gap (flying height) between the element portion of a magnetic head and the medium surface becomes extremely small. When irregularity due to a bubble is present on the surface of a magnetic recording medium substrate, the irregularity is reflected on the surface of the magnetic recording medium to thereby lower the surface smoothness of the magnetic recording medium. When a magnetic head is moved closer to a magnetic recording medium surface having inferior surface smoothness, the magnetic head may contact the magnetic recording medium surface to damage the magnetic head. Therefore, it is inevitable to secure some degree of flying height in order to prevent the contact. From the above viewpoint, in magnetic recording medium substrates, it is desirable to reduce bubbles on substrates in order to produce a magnetic recording medium having high surface smoothness. The reduction in bubbles on a substrate makes it possible to narrow flying height. In the above magnetic recording medium substrate, preferably bubbles have been reduced, and thus the above magnetic recording medium provided with the substrate like this is also suitable for magnetic recording apparatuses on which a DFH mechanism with extremely narrowed flying height is mounted.

Dimensions of both of the above magnetic recording medium substrate (for example, magnetic disk substrate) and magnetic recording medium (for example, magnetic disk) are not particularly limited, and for example, the medium and substrate can also be downsized since higher recording density is possible. For example, they can have a dimension of a nominal diameter of, needless to say, 2.5 inches, a smaller diameter (for example, 1 inch, 1.8 inches), 3 inches, 3.5 inches or the like.

[Glass Spacer for Magnetic Recording and Reproducing Apparatus]

An aspect of the present invention relates to a glass spacer for a magnetic recording and reproducing apparatus, the glass spacer comprised of amorphous oxide glass, wherein, in terms of mol %:

an $SiO_2$ content ranges from 45 to 68%;

an $Al_2O_3$ content ranges from 5 to 20%;

a total content of $SiO_2$ and $Al_2O_3$ ($SiO_2+Al_2O_3$) ranges from 60 to 80%;

a $B_2O_3$ content ranges from 0 to 5%;

an MgO content ranges from 3 to 28%;

a CaO content ranges from 0 to 18%;

a total content of BaO and SrO (BaO+SrO) ranges from 0 to 2%;

a total content of alkali earth metal oxides (MgO+CaO+SrO+BaO) ranges from 12 to 30%;

a total content of alkali metal oxides ($Li_2O+Na_2O+K_2O$) ranges from 3.5 to 15%; and at least one kind selected from the group consisting of Sn oxide and Ce oxide being included, a total content of Sn oxide and Ce oxide ranges from 0.05 to 2.00%, a glass transition temperature is equal to or higher than 625° C.;

a Young's modulus is equal to or more than 83 GPa;

a specific gravity is equal to or less than 2.85; and an average linear expansion coefficient at 100 to 300° C. is equal to or more than $48 \times 10^{-7}$/° C.

A magnetic recording medium can be used for magnetically recording and/or reproducing information in a magnetic recording and reproducing apparatus. A magnetic recording and reproducing apparatus is usually provided with a spacer for fixing a magnetic recording medium to a spindle of a spindle motor and/or for keeping a distance between plural magnetic recording media. Recently, the use of a glass spacer as the spacer like this is proposed. For a reason similar to the reason described in detail as to a glass for magnetic recording medium substrate, this spacer is also desired to be excellent in heat resistance, rigidity and glass stability, to have a low specific gravity, and to have a suitable thermal expansion coefficient. In contrast, the above glass is suitable as a glass spacer for magnetic recording and reproducing apparatus since the above glass can have excellent heat resistance, rigidity and glass stability, low specific gravity, and suitable thermal expansion coefficient, as described above about a glass for magnetic recording medium substrate in an aspect of the present invention.

A spacer for magnetic recording and reproducing apparatus is a ring-shaped member, and details of a configuration, manufacturing method and the like of a glass spacer are known. Furthermore, with respect to a manufacturing method of a glass spacer, the above description about a manufacturing method of glass for magnetic recording medium substrate and a manufacturing method of a magnetic recording medium substrate can also be referred to. Moreover, with respect to other details of a glass composition, glass properties and the like of the glass spacer for magnetic recording and reproducing apparatus according to an aspect of the present invention, the above description about the glass for magnetic recording medium substrate, magnetic recording medium substrate and magnetic recording medium according to respective aspects of the present invention can be referred to.

In order to eliminate static electricity generated in rotation of a magnetic recording medium, an electroconductive film can also be formed by an immersion method, evaporation method, spattering method or the like on the surface of a glass spacer. Surface smoothness of a glass spacer can be enhanced by polishing processing (for example, average surface roughness is equal to or less than 1 µm), which can increase an adherence between a magnetic recording medium and a spacer to thereby suppress occurrence of positional displacement.

[Magnetic Recording and Reproducing Apparatus]

An aspect of the present invention relates to a magnetic recording and reproducing apparatus, which includes at least one of:

the magnetic recording medium according to an aspect of the present invention; and the glass spacer according to an aspect of the present invention.

A magnetic recording and reproducing apparatus includes at least one magnetic recording medium and at least one spacer, and further includes usually a spindle motor for rotationally driving the magnetic recording medium, and at least one magnetic head for performing recording and/or reproduction of information to the magnetic recording medium.

The above magnetic recording and reproducing apparatus according to an aspect of the present invention can include, as at least one magnetic recording medium, the magnetic recording medium according to an aspect of the present invention, and also can include a plurality of magnetic recording media according to an aspect of the present invention. The above magnetic recording and reproducing apparatus according to an aspect of the present invention can include, as at least one spacer, the glass spacer according to an aspect of the present invention, and also can include a plurality of glass spacers according to an aspect of the present invention. Small difference between a thermal expansion coefficient of a magnetic recording medium and a thermal expansion coefficient of a spacer is preferable from the viewpoint of suppressing generation of phenomena that may be generated due to the difference between thermal expansion coefficients of the two, for example, strain of a magnetic recording medium and lowering of stability in rotation due to positional displacement of a magnetic recording medium. From this viewpoint, it is preferable that the magnetic recording and reproducing apparatus according to an aspect of the present invention includes: the magnetic recording medium according to an aspect of the present invention, as at least one magnetic recording medium, and as more magnetic recording media in a case where plural magnetic recording media are to be included; and includes: the glass spacer according to an aspect of the present invention, as at least one spacer, and as more spacers in a case where plural spacers are to be included. Furthermore, for example, the magnetic recording and reproducing apparatus according to an aspect of the present invention can be one in which the glass constituting the magnetic recording medium substrate contained in the magnetic recording medium and the glass constituting the glass spacer have the same glass composition.

The magnetic recording and reproducing apparatus according to an aspect of the present invention may be one that contains at least one of the magnetic recording medium according to an aspect of the present invention and the glass spacer according to an aspect of the present invention. Known techniques related to magnetic recording and reproducing apparatuses can be applied to other points. In an embodiment, an energy-assisted magnetic recording head having: an energy source (for example, heat source such as a laser light source, microwaves and the like) for assisting magnetization reversal (assisting writing of magnetic signals); a recording element portion; and a reproducing element portion, can be used as a magnetic head. The magnetic recording and reproducing apparatus, as described above, using an energy-assisted recording system containing the energy-assisted magnetic recording head is useful as a magnetic recording and reproducing apparatus having high recording density and high reliability. Furthermore, when manufacturing a magnetic recording medium used for a magnetic recording and reproducing apparatus of an energy-assisted recording system such as a heat-assisted recording system provided with a heat-assisted magnetic recording head having a laser light source or the like, sometimes a magnetic recording layer containing a magnetic material with high magnetic anisotropy energy is formed on a magnetic recording medium substrate. In order to form such magnetic recording layer, film formation is usually performed at a high temperature or a heat treatment is performed at a high temperature after film formation. As a magnetic recording medium substrate that may have high heat resistance capable of withstanding such treatment at high temperatures like this, the magnetic recording medium substrate according to an aspect of the present invention is preferable. However, the magnetic recording and reproducing apparatus according to an aspect of the present invention is not limited to an energy-assisted magnetic recording and reproducing apparatus.

EXAMPLES

Hereinafter, the present invention will be described in more detail with reference to Examples. However, the present invention is not limited to embodiments represented in Examples.

Examples No. 1 to No. 47, Comparative Examples 1 to 5, Reference Example 1

Raw materials such as oxide, carbonate, nitrate and hydroxide were weighed so as to give glasses with respective compositions as shown in Table 1, which were then mixed to give respective compounded raw materials. Each molten glass obtained by throwing the compounded raw material into a melting tank and by heating and melting the same in a range of 1400 to 1600° C., was held at 1400 to 1550° C. for 6 hours in a clarification tank. Subsequently, the temperature of the tank was lowered (temperature decrease) and each molten glass was held in a range of 1200 to 1400° C. for 1 hour and was then molded to give each glass (amorphous oxide glass) for evaluation described below.

[Evaluation Method]

(1) Glass Transition Temperature (Tg), Average Linear Expansion Coefficient (α)

Glass transition temperature Tg, and average linear expansion coefficient α at 100 to 300° C. of each glass were measured using a thermomechanical analysis (TMA) apparatus.

(2) Young's Modulus

A Young's modulus of each glass was measured by an ultrasonic method.

(3) Specific Gravity

A specific gravity of each glass was measured by the Archimedes method.

(4) Specific Elastic Modulus

From the Young's modulus obtained in (2) and the specific gravity obtained in (3), a specific elastic modulus was calculated.

(5) Glass Stability

Each glass of 100 g was placed in a platinum crucible, and each crucible was thrown into a heating furnace whose in-furnace temperature was set to 1250° C. or 1300° C., which was then left to stand for 16 hours while the in-furnace temperature was kept (holding test). After a lapse of 16 hours, each crucible was taken out from the heating furnace, each glass in each crucible was moved onto a refractory and was cooled to room temperature, the presence or absence of crystals of each glass was observed with an optical microscope, and evaluation was performed on the basis of the standard below.

A: no crystals are confirmed by magnification observation (magnifying power of 40 to 100) with an optical microscope.

B: crystals are confirmed by magnification observation (magnifying power of 40 to 100) with an optical microscope, but no crystals are confirmed by visual observation.

C: crystals are observed by visual observation.

(6) Evaluation of Bubble Density Rank

From the molten glass obtained in the above method, a glass plate (substrate blank) having a thickness of about 1.2 mm was produced. The surface of this glass plate was polished so as to be flat and to be smooth. From the polished surface, the inside of the glass was subjected to magnification observation (magnifying power of 40 to 100) with an optical microscope, and the number of bubbles each having a diameter exceeding 0.03 mm (hereinafter, simply referred to as "bubble") was counted. The number of counted bubbles was divided by a mass of glass corresponding to the region subjected to the magnification observation and the division result was defined as a density of bubbles.

Bubble density ranks were evaluated on the basis of S-rank to F-rank in accordance with the bubble density obtained by the above method. Specifically, ranks were defined as follows. S-rank: bubble density is 0/kg, A-rank: bubbles are present and bubble density is equal to or less than 2/kg, B-rank: bubble density is exceeding 2/kg to less than 10/kg, C-rank: bubble density is equal to or more than 10/kg to less than 20/kg, D-rank: bubble density is equal to or more than 20/kg to less than 50/kg, E-rank: bubble density is equal to or more than 50/kg to less than 80, and F-rank: bubble density is equal to or more than 80/kg.

The above results are shown in Table 1 (Tables 1-1 to 1-6).

TABLE 1-1

| Components, properties | Example No. | | | | | | | | | |
|---|---|---|---|---|---|---|---|---|---|---|
| | No. 1 mol % | No. 2 mol % | No. 3 mol % | No. 4 mol % | No. 5 mol % | No. 6 mol % | No. 7 mol % | No. 8 mol % | No. 9 mol % | No. 10 mol % |
| $SiO_2$ | 54.90 | 54.83 | 54.62 | 54.50 | 54.97 | 55.89 | 54.83 | 54.75 | 54.96 | 54.75 |
| $Al_2O_3$ | 12.87 | 12.85 | 12.85 | 9.90 | 12.98 | 12.94 | 13.93 | 12.95 | 12.96 | 9.96 |
| $B_2O_3$ | 2.97 | 2.96 | 3.92 | 4.95 | 1.00 | 0.00 | 0.00 | 0.00 | 0.00 | 1.00 |
| MgO | 20.80 | 20.85 | 22.25 | 25.80 | 22.00 | 21.95 | 21.95 | 22.89 | 21.94 | 21.95 |
| CaO | 0.00 | 3.95 | 1.47 | 0.00 | 3.00 | 3.00 | 3.00 | 3.00 | 4.00 | 3.00 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 0.00 | 0.00 | 0.00 |
| $Li_2O$ | 3.00 | 0.00 | 0.00 | 0.00 | 3.00 | 3.00 | 3.00 | 3.00 | 3.00 | 3.00 |
| $Na_2O$ | 1.00 | 3.95 | 3.92 | 3.96 | 1.00 | 1.00 | 1.00 | 1.00 | 1.00 | 1.00 |
| $K_2O$ | 0.00 | 0.00 | 0.00 | 0.00 | 0.00 | 0.00 | 0.00 | 0.00 | 0.00 | 0.00 |
| $TiO_2$ | 3.96 | 0.00 | 0.00 | 0.00 | 2.00 | 2.00 | 2.00 | 2.00 | 2.00 | 4.96 |
| $Y_2O_3$ | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.00 | 0.25 | 0.73 | 0.73 | 0.05 | 0.15 | 0.15 | 0.25 | 0.09 | 0.25 |

TABLE 1-1-continued

| Components, properties | No. 1 mol % | No. 2 mol % | No. 3 mol % | No. 4 mol % | No. 5 mol % | No. 6 mol % | No. 7 mol % | No. 8 mol % | No. 9 mol % | No. 10 mol % |
|---|---|---|---|---|---|---|---|---|---|---|
| $CeO_2$ | 0.50 | 0.35 | 0.24 | 0.17 | 0.01 | 0.08 | 0.14 | 0.16 | 0.05 | 0.13 |
| 合計 | 100.00 | 100.00 | 100.00 | 100.00 | 100.00 | 100.00 | 100.00 | 100.00 | 100.00 | 100.00 |
| $SiO_2 + Al_2O_3$ | 67.77 | 67.68 | 67.47 | 64.40 | 67.95 | 68.83 | 68.76 | 67.70 | 67.92 | 64.71 |
| $BaO + SrO$ | 0.00 | 0.00 | 0.00 | 0.00 | 0.00 | 0.00 | 0.00 | 0.00 | 0.00 | 0.00 |
| $MgO + CaO + SrO + BaO$ | 20.80 | 24.80 | 23.72 | 25.80 | 25.00 | 24.95 | 24.95 | 25.89 | 25.94 | 24.95 |
| $Li_2O + Na_2O + K_2O$ | 4.00 | 3.95 | 3.92 | 3.96 | 3.99 | 4.00 | 4.00 | 4.00 | 4.00 | 4.00 |
| $Li_2O/(Li_2O + Na_2O + K_2O)$ | 0.75 | 0.00 | 0.00 | 0.00 | 0.75 | 0.75 | 0.75 | 0.75 | 0.75 | 0.75 |
| $Na_2O/(Li_2O + Na_2O + K_2O)$ | 0.25 | 1.00 | 1.00 | 1.00 | 0.25 | 0.25 | 0.25 | 0.25 | 0.25 | 0.25 |
| $SnO_2 + CeO_2$ | 0.50 | 0.60 | 0.97 | 0.90 | 0.06 | 0.23 | 0.29 | 0.41 | 0.14 | 0.38 |
| $(MgO + CaO)/(MgO + CaO + SrO + BaO)$ | 1.00 | 1.00 | 1.00 | 1.00 | 1.00 | 1.00 | 1.00 | 1.00 | 1.00 | 1.00 |
| $MgO/(MgO + CaO + SrO + BaO)$ | 1.00 | 0.84 | 0.94 | 1.00 | 0.88 | 0.88 | 0.88 | 0.88 | 0.85 | 0.88 |
| Tg (° C.) | 667 | 694 | 696 | 689 | 680 | 689 | 689 | 687 | 685 | 664 |
| α (×$10^{-7}$/° C.) | 50.0 | 52.3 | 51.5 | 54.3 | 50.2 | 52.1 | 51.3 | 51.9 | 53.3 | 53.3 |
| Specific gravity | 2.588 | 2.568 | 2.557 | 2.539 | 2.626 | 2.632 | 2.640 | 2.643 | 2.636 | 2.640 |
| Young's modulus (GPa) | 97.1 | 91.1 | 90.3 | 90.1 | 99.6 | 99.1 | 101.2 | 101.0 | 100.8 | 98.7 |
| Specific elastic modulus (MNm/kg) | 37.5 | 35.5 | 35.3 | 35.5 | 37.9 | 37.7 | 38.3 | 38.2 | 38.2 | 37.4 |
| Holding test 1300° C. 16 hr | A | A | A | A | A | A | A | A | A | A |
| Holding test 1250° C. 16 hr | A | A | A | C | A | A | A | A | A | A |
| Bubble density rank | B | S | A | A | A | A | S | S | A | S |

TABLE 1-2

| Components, properties | No. 11 mol % | No. 12 mol % | No. 13 mol % | No. 14 mol % | No. 15 mol % | No. 16 mol % | No. 17 mol % | No. 18 mol % | No. 19 mol % | No. 20 mol % |
|---|---|---|---|---|---|---|---|---|---|---|
| $SiO_2$ | 54.90 | 52.80 | 50.92 | 54.68 | 55.32 | 53.55 | 58.64 | 59.82 | 59.80 | 59.92 |
| $Al_2O_3$ | 12.96 | 13.93 | 14.91 | 13.90 | 14.05 | 12.80 | 16.98 | 14.93 | 14.90 | 14.98 |
| $B_2O_3$ | 0.00 | 0.00 | 0.00 | 0.00 | 0.00 | 0.00 | 0.00 | 0.00 | 0.00 | 0.00 |
| MgO | 22.00 | 22.95 | 22.90 | 22.89 | 23.01 | 24.70 | 10.00 | 9.95 | 9.94 | 9.98 |
| CaO | 3.00 | 3.00 | 3.00 | 3.00 | 0.00 | 0.00 | 10.00 | 9.95 | 9.94 | 9.98 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.40 | 0.00 | 0.00 | 0.00 | 0.00 | 0.00 |
| $Li_2O$ | 3.00 | 4.00 | 4.97 | 4.00 | 4.00 | 0.00 | 0.50 | 0.00 | 4.95 | 2.50 |
| $Na_2O$ | 1.00 | 1.00 | 1.00 | 1.00 | 1.00 | 5.40 | 2.98 | 4.96 | 0.00 | 2.50 |
| $K_2O$ | 0.00 | 0.00 | 0.00 | 0.00 | 0.00 | 0.00 | 0.50 | 0.00 | 0.00 | 0.00 |
| $TiO_2$ | 2.00 | 2.00 | 2.00 | 0.00 | 2.00 | 1.57 | 0.00 | 0.00 | 0.00 | 0.00 |
| $Y_2O_3$ | 0.00 | 0.00 | 0.00 | 0.00 | 0.00 | 0.98 | 0.00 | 0.00 | 0.00 | 0.00 |
| $P_2O_5$ | 1.00 | 0.00 | 0.00 | 0.00 | 0.00 | 0.00 | 0.00 | 0.00 | 0.00 | 0.00 |
| $SnO_2$ | 0.09 | 0.20 | 0.20 | 0.36 | 0.15 | 0.63 | 0.30 | 0.25 | 0.30 | 0.09 |
| $CeO_2$ | 0.05 | 0.12 | 0.10 | 0.17 | 0.08 | 0.37 | 0.10 | 0.14 | 0.18 | 0.05 |
| 合計 | 100.00 | 100.00 | 100.00 | 100.00 | 100.00 | 100.00 | 100.00 | 100.00 | 100.01 | 100.00 |
| $SiO_2 + Al_2O_3$ | 67.86 | 66.73 | 65.83 | 68.58 | 69.37 | 66.35 | 75.62 | 74.75 | 74.70 | 74.90 |
| $BaO + SrO$ | 0.00 | 0.00 | 0.00 | 0.00 | 0.00 | 0.00 | 0.00 | 0.00 | 0.00 | 0.00 |
| $MgO + CaO + SrO + BaO$ | 25.00 | 25.95 | 25.90 | 25.89 | 23.01 | 24.70 | 20.00 | 19.90 | 19.88 | 19.96 |
| $Li_2O + Na_2O + K_2O$ | 4.00 | 5.00 | 5.97 | 5.00 | 5.00 | 5.40 | 3.98 | 4.96 | 4.95 | 5.00 |
| $Li_2O/(Li_2O + Na_2O + K_2O)$ | 0.75 | 0.80 | 0.83 | 0.80 | 0.80 | 0.00 | 0.13 | 0.00 | 1.00 | 0.50 |
| $Na_2O/(Li_2O + Na_2O + K_2O)$ | 0.25 | 0.20 | 0.17 | 0.20 | 0.20 | 1.00 | 0.75 | 1.00 | 0.00 | 0.50 |
| $SnO_2 + CeO_2$ | 0.14 | 0.32 | 0.30 | 0.53 | 0.23 | 1.00 | 0.40 | 0.39 | 0.48 | 0.14 |
| $(MgO + CaO)/(MgO + CaO + SrO + BaO)$ | 1.00 | 1.00 | 1.00 | 1.00 | 1.00 | 1.00 | 1.00 | 1.00 | 1.00 | 1.00 |
| $MgO/(MgO + CaO + SrO + BaO)$ | 0.88 | 0.88 | 0.88 | 0.88 | 1.00 | 1.00 | 0.50 | 0.50 | 0.50 | 0.50 |
| Tg (° C.) | 685 | 669 | 663 | 680 | 683 | 713 | 751 | 725 | 685 | 689 |
| α (×$10^{-7}$/° C.) | 52.0 | 55.2 | 58.4 | 53.2 | 51.8 | 54.5 | 52.2 | 56.7 | 55.6 | 52.0 |
| Specific gravity | 2.608 | 2.652 | 2.659 | 2.617 | 2.624 | 2.618 | 2.610 | 2.581 | 2.576 | 2.579 |
| Young's modulus (GPa) | 96.9 | 102.2 | 103.2 | 100.3 | 101.3 | 93.8 | 90.1 | 89.5 | 94.6 | 92.7 |
| Specific elastic modulus (MNm/kg) | 37.2 | 38.5 | 38.8 | 38.3 | 38.6 | 35.8 | 34.5 | 34.7 | 36.7 | 35.9 |
| Holding test 1300° C. 16 hr | A | A | A | A | A | A | A | A | A | A |
| Holding test 1250° C. 16 hr | A | A | A | A | A | A | A | A | A | A |
| Bubble density rank | A | S | S | S | A | A | S | A | S | A |

TABLE 1-3

| Components, properties | No. 21 mol % | No. 22 mol % | No. 23 mol % | No. 24 mol % | No. 25 mol % | No. 26 mol % | No. 27 mol % | No. 28 mol % | No. 29 mol % | No. 30 mol % |
|---|---|---|---|---|---|---|---|---|---|---|
| $SiO_2$ | 59.74 | 53.91 | 60.27 | 58.56 | 59.20 | 48.77 | 63.91 | 64.09 | 66.49 | 54.93 |
| $Al_2O_3$ | 13.01 | 16.97 | 14.97 | 8.56 | 14.75 | 17.11 | 9.97 | 5.21 | 7.88 | 9.98 |
| $B_2O_3$ | 0.00 | 0.00 | 0.00 | 0.00 | 0.00 | 0.00 | 0.00 | 0.00 | 0.00 | 0.00 |
| MgO | 9.95 | 9.95 | 6.84 | 12.36 | 9.81 | 17.11 | 12.47 | 6.50 | 6.54 | 25.94 |
| CaO | 9.95 | 9.95 | 12.40 | 16.28 | 8.70 | 10.00 | 9.50 | 12.50 | 9.87 | 3.00 |
| SrO | 0.00 | 0.00 | 0.00 | 0.00 | 0.00 | 0.00 | 0.00 | 0.00 | 1.93 | 0.00 |
| BaO | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $ZrO_2$ | 0.00 | 0.00 | 0.00 | 0.00 | 0.00 | 0.00 | 0.00 | 2.00 | 2.00 | 0.00 |
| $Li_2O$ | 0.00 | 0.00 | 0.00 | 2.50 | 6.91 | 0.00 | 1.00 | 2.00 | 0.00 | 3.00 |
| $Na_2O$ | 6.95 | 8.98 | 4.95 | 1.00 | 0.00 | 6.95 | 3.00 | 3.30 | 4.34 | 1.00 |
| $K_2O$ | 0.00 | 0.00 | 0.00 | 0.50 | 0.00 | 0.00 | 0.00 | 4.18 | 0.00 | 0.00 |
| $TiO_2$ | 0.00 | 0.00 | 0.00 | 0.00 | 0.00 | 0.00 | 0.00 | 0.00 | 0.00 | 2.00 |
| $Y_2O_3$ | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.25 | 0.15 | 0.37 | 0.25 | 0.50 | 0.06 | 0.15 | 0.07 | 0.65 | 0.00 |
| $CeO_2$ | 0.15 | 0.08 | 0.20 | 0.00 | 0.13 | 0.00 | 0.00 | 0.15 | 0.30 | 0.15 |
| 合計 | 100.00 | 100.00 | 100.00 | 100.00 | 100.00 | 100.00 | 100.00 | 100.00 | 100.00 | 100.00 |
| $SiO_2 + Al_2O_3$ | 72.75 | 70.88 | 75.24 | 67.12 | 73.95 | 65.88 | 73.88 | 69.30 | 74.37 | 64.91 |
| BaO + SrO | 0.00 | 0.00 | 0.00 | 0.00 | 0.00 | 0.00 | 0.00 | 0.00 | 1.93 | 0.00 |
| MgO + CaO + SrO + BaO | 19.90 | 19.91 | 19.24 | 28.64 | 18.51 | 27.11 | 21.97 | 19.00 | 18.34 | 28.94 |
| $Li_2O + Na_2O + K_2O$ | 6.95 | 8.98 | 4.95 | 4.00 | 6.91 | 6.95 | 4.00 | 9.48 | 4.34 | 4.00 |
| $Li_2O/(Li_2O + Na_2O + K_2O)$ | 0.00 | 0.00 | 0.00 | 0.63 | 1.00 | 0.00 | 0.25 | 0.21 | 0.00 | 0.75 |
| $Na_2O/(Li_2O + Na_2O + K_2O)$ | 1.00 | 1.00 | 1.00 | 0.25 | 0.00 | 1.00 | 0.75 | 0.35 | 1.00 | 0.25 |
| $SnO_2 + CeO_2$ | 0.40 | 0.23 | 0.57 | 0.25 | 0.63 | 0.06 | 0.15 | 0.22 | 0.95 | 0.15 |
| (MgO + CaO)/(MgO + CaO + SrO + BaO) | 1.00 | 1.00 | 1.00 | 1.00 | 1.00 | 1.00 | 1.00 | 1.00 | 0.89 | 1.00 |
| MgO/(MgO + CaO + SrO + BaO) | 0.50 | 0.50 | 0.36 | 0.43 | 0.53 | 0.63 | 0.57 | 0.34 | 0.36 | 0.90 |
| Tg (° C.) | 695 | 692 | 725 | 726 | 675 | 692 | 693 | 628 | 685 | 676 |
| α (×$10^{-7}$/° C.) | 63.9 | 68.8 | 56.7 | 53.2 | 58.6 | 69.0 | 54.0 | 78.0 | 57.0 | 54.0 |
| Specific gravity | 2.575 | 2.598 | 2.581 | 2.600 | 2.576 | 2.600 | 2.560 | 2.610 | 2.610 | 2.650 |
| Young's modulus (GPa) | 88.0 | 89.0 | 89.5 | 91.0 | 94.6 | 94.0 | 90.0 | 85.0 | 87.0 | 102.0 |
| Specific elastic modulus (MNm/kg) | 34.2 | 34.3 | 34.7 | 35.0 | 36.7 | 36.2 | 35.2 | 32.6 | 33.3 | 38.5 |
| Holding test 1300° C. 16 hr | A | A | A | A | A | A | A | A | A | A |
| Holding test 1250° C. 16 hr | A | A | A | A | A | B | A | A | A | C |
| Bubble density rank | S | A | S | B | S | B | B | A | A | B |

TABLE 1-4

| Components, properties | No. 31 mol % | No. 32 mol % | No. 33 mol % | No. 34 mol % | No. 35 mol % | No. 36 mol % | No. 37 mol % | No. 38 mol % | No. 39 mol % | No. 40 mol % |
|---|---|---|---|---|---|---|---|---|---|---|
| $SiO_2$ | 63.98 | 53.84 | 53.77 | 53.83 | 53.90 | 55.92 | 55.91 | 53.89 | 53.89 | 53.44 |
| $Al_2O_3$ | 5.16 | 16.92 | 16.93 | 16.93 | 16.97 | 16.97 | 16.97 | 16.98 | 16.97 | 16.80 |
| $B_2O_3$ | 0.00 | 0.00 | 0.00 | 0.00 | 0.00 | 0.00 | 0.00 | 0.00 | 0.00 | 0.00 |
| MgO | 6.47 | 9.95 | 9.95 | 9.95 | 9.95 | 9.95 | 9.95 | 9.95 | 9.95 | 12.78 |
| CaO | 12.39 | 9.95 | 9.95 | 9.95 | 9.95 | 9.95 | 9.95 | 7.98 | 5.99 | 2.95 |
| SrO | 0.00 | 0.00 | 0.00 | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 | 0.00 | 0.00 | 0.00 |
| $ZrO_2$ | 2.96 | 0.00 | 0.00 | 0.00 | 0.00 | 0.00 | 0.00 | 0.00 | 0.00 | 0.00 |
| $Li_2O$ | 2.00 | 0.50 | 1.00 | 1.50 | 2.00 | 0.50 | 1.00 | 0.00 | 0.00 | 0.00 |
| $Na_2O$ | 5.24 | 7.95 | 6.93 | 5.96 | 5.00 | 5.99 | 5.00 | 8.98 | 8.98 | 8.87 |
| $K_2O$ | 0.00 | 0.50 | 1.00 | 1.50 | 2.00 | 0.50 | 1.00 | 0.00 | 0.00 | 0.00 |
| $TiO_2$ | 1.20 | 0.00 | 0.00 | 0.00 | 0.00 | 0.00 | 0.00 | 2.00 | 4.00 | 3.94 |
| $Y_2O_3$ | 0.00 | 0.00 | 0.00 | 0.00 | 0.00 | 0.00 | 0.00 | 0.00 | 0.00 | 0.00 |
| $P_2O_5$ | 0.00 | 0.00 | 0.00 | 0.00 | 0.00 | 0.00 | 0.00 | 0.00 | 0.00 | 0.00 |
| $SnO_2$ | 0.35 | 0.20 | 0.30 | 0.25 | 0.15 | 0.15 | 0.15 | 0.15 | 0.15 | 0.87 |
| $CeO_2$ | 0.25 | 0.20 | 0.17 | 0.13 | 0.07 | 0.07 | 0.07 | 0.07 | 0.07 | 0.35 |
| 合計 | 100.00 | 100.00 | 100.00 | 100.00 | 100.00 | 100.00 | 100.00 | 100.00 | 100.00 | 100.00 |
| $SiO_2 + Al_2O_3$ | 69.14 | 70.76 | 70.70 | 70.76 | 70.87 | 72.89 | 72.88 | 70.87 | 70.86 | 70.24 |
| BaO + SrO | 0.00 | 0.00 | 0.00 | 0.00 | 0.00 | 0.00 | 0.00 | 0.00 | 0.00 | 0.00 |
| MgO + CaO + SrO + BaO | 18.86 | 19.90 | 19.90 | 19.90 | 19.91 | 19.91 | 19.91 | 17.93 | 15.94 | 15.73 |
| $Li_2O + Na_2O + K_2O$ | 7.24 | 8.94 | 8.93 | 8.96 | 9.00 | 6.99 | 6.99 | 8.98 | 8.98 | 8.87 |
| $Li_2O/(Li_2O + Na_2O + K_2O)$ | 0.28 | 0.06 | 0.11 | 0.17 | 0.22 | 0.07 | 0.14 | 0.00 | 0.00 | 0.00 |
| $Na_2O/(Li_2O + Na_2O + K_2O)$ | 0.72 | 0.89 | 0.78 | 0.67 | 0.56 | 0.86 | 0.72 | 1.00 | 1.00 | 1.00 |
| $SnO_2 + CeO_2$ | 0.60 | 0.40 | 0.47 | 0.38 | 0.22 | 0.22 | 0.22 | 0.22 | 0.22 | 1.22 |

TABLE 1-4-continued

|  | Example No. | | | | | | | | | |
|---|---|---|---|---|---|---|---|---|---|---|
| Components, properties | No. 31 mol % | No. 32 mol % | No. 33 mol % | No. 34 mol % | No. 35 mol % | No. 36 mol % | No. 37 mol % | No. 38 mol % | No. 39 mol % | No. 40 mol % |
| (MgO + CaO)/ (MgO + CaO + SrO + BaO) | 1.00 | 1.00 | 1.00 | 1.00 | 1.00 | 1.00 | 1.00 | 1.00 | 1.00 | 1.00 |
| MgO/(MgO + CaO + SrO + BaO) | 0.34 | 0.50 | 0.50 | 0.50 | 0.50 | 0.50 | 0.50 | 0.56 | 0.62 | 0.81 |
| Tg (° C.) | 639 | 682 | 677 | 668 | 653 | 704 | 696 | 696 | 690 | 692 |
| α (×10$^{-7}$/° C.) | 68.0 | 68.7 | 67.1 | 66.5 | 64.8 | 62.4 | 58.8 | 66.1 | 67.4 | 63.5 |
| Specific gravity | 2.650 | 2.608 | 2.606 | 2.609 | 2.611 | 2.603 | 2.610 | 2.601 | 2.587 | 2.568 |
| Young's modulus (GPa) | 90.0 | 90.9 | 91.3 | 92.5 | 93.3 | 91.8 | 92.4 | 87.7 | 87.8 | 88.3 |
| Specific elastic modulus (MNm/kg) | 34.0 | 34.9 | 35.0 | 35.5 | 35.7 | 35.3 | 35.4 | 33.7 | 33.9 | 34.4 |
| Holding test 1300° C. 16 hr | A | A | A | A | A | A | A | A | A | A |
| Holding test 1250° C. 16 hr | A | A | A | A | A | A | A | A | A | C |
| Bubble density rank | S | S | S | S | A | A | A | A | A | A |

TABLE 1-5

|  | Example No. | | | | | | |
|---|---|---|---|---|---|---|---|
| Components, properties | No. 41 mol % | No. 42 mol % | No. 43 mol % | No. 44 mol % | No. 45 mol % | No. 46 mol % | No. 47 mol % |
| SiO$_2$ | 53.75 | 59.89 | 59.95 | 59.73 | 59.91 | 59.95 | 60.52 |
| Al$_2$O$_3$ | 16.98 | 14.96 | 15.00 | 14.90 | 14.96 | 15.16 | 15.20 |
| B$_2$O$_3$ | 0.00 | 0.00 | 0.00 | 0.00 | 0.00 | 0.18 | 0.18 |
| MgO | 9.92 | 9.97 | 9.98 | 9.94 | 9.98 | 9.83 | 9.85 |
| CaO | 4.95 | 9.97 | 9.98 | 9.94 | 9.98 | 9.57 | 9.35 |
| SrO | 0.00 | 0.00 | 0.00 | 0.00 | 0.00 | 0.00 | 0.00 |
| BaO | 0.00 | 0.00 | 0.00 | 0.00 | 0.00 | 0.00 | 0.00 |
| ZnO | 0.00 | 0.00 | 0.00 | 0.00 | 0.00 | 0.00 | 0.00 |
| ZrO$_2$ | 0.00 | 0.00 | 0.00 | 0.00 | 0.00 | 0.00 | 0.00 |
| Li$_2$O | 1.00 | 0.00 | 0.00 | 4.94 | 4.97 | 4.19 | 3.78 |
| Na$_2$O | 8.94 | 4.98 | 4.99 | 0.00 | 0.00 | 0.00 | 0.00 |
| K$_2$O | 0.00 | 0.00 | 0.00 | 0.00 | 0.00 | 0.00 | 0.00 |
| TiO$_2$ | 3.96 | 0.00 | 0.00 | 0.00 | 0.00 | 0.78 | 0.78 |
| Y$_2$O$_3$ | 0.00 | 0.00 | 0.00 | 0.00 | 0.00 | 0.00 | 0.00 |
| P$_2$O$_5$ | 0.00 | 0.00 | 0.00 | 0.00 | 0.00 | 0.00 | 0.00 |
| SnO$_2$ | 0.15 | 0.15 | 0.07 | 0.45 | 0.12 | 0.21 | 0.21 |
| CeO$_2$ | 0.35 | 0.08 | 0.03 | 0.10 | 0.08 | 0.13 | 0.13 |
| 合計 | 100.00 | 100.00 | 100.00 | 100.00 | 100.00 | 100.00 | 100.00 |
| SiO$_2$ + Al$_2$O$_3$ | 70.73 | 74.85 | 74.95 | 74.63 | 74.87 | 75.11 | 75.72 |
| BaO + SrO | 0.00 | 0.00 | 0.00 | 0.00 | 0.00 | 0.00 | 0.00 |
| MgO + CaO + SrO + BaO | 14.87 | 19.94 | 19.96 | 19.88 | 19.96 | 19.40 | 19.20 |
| Li$_2$O + Na$_2$O + K$_2$O | 9.94 | 4.98 | 4.99 | 4.94 | 4.97 | 4.19 | 3.78 |
| Li$_2$O/(Li$_2$O + Na$_2$O + K$_2$O) | 0.10 | 0.00 | 0.00 | 1.00 | 1.00 | 1.00 | 1.00 |
| Na$_2$O/(Li$_2$O + Na$_2$O + K$_2$O) | 0.90 | 1.00 | 1.00 | 0.00 | 0.00 | 0.00 | 0.00 |
| SnO$_2$ + CeO$_2$ | 0.50 | 0.23 | 0.10 | 0.55 | 0.20 | 0.34 | 0.34 |
| (MgO + CaO)/ (MgO + CaO + SrO + BaO) | 1.00 | 1.00 | 1.00 | 1.00 | 1.00 | 1.00 | 1.00 |
| MgO/(MgO + CaO + SrO + BaO) | 0.67 | 0.50 | 0.50 | 0.50 | 0.50 | 0.51 | 0.51 |
| Tg (° C.) | 673 | 725 | 725 | 685 | 685 | 700 | 706 |
| α (×10$^{-7}$/° C.) | 66.1 | 56.7 | 56.7 | 55.6 | 55.6 | 49.4 | 48.2 |
| Specific gravity | 2.593 | 2.581 | 2.581 | 2.576 | 2.576 | 2.590 | 2.590 |
| Young's modulus (GPa) | 89.3 | 89.5 | 89.5 | 94.6 | 94.6 | 95.2 | 94.2 |
| Specific elastic modulus (MNm/kg) | 34.4 | 34.7 | 34.7 | 36.7 | 36.7 | 36.7 | 36.4 |
| Holding test 1300° C. 16 hr | A | A | A | A | A | A | A |
| Holding test 1250° C. 16 hr | A | A | A | A | A | A | A |
| Bubble density rank | A | A | A | S | S | A | A |

TABLE 1-6

| Components, properties | Comp. Ex. 1 mol % | Comp. Ex. 2 mol % | Comp. Ex. 3 mol % | Comp. Ex. 4 mol % | Comp. Ex. 5 mol % | Ref. Ex. 1 mol % |
|---|---|---|---|---|---|---|
| $SiO_2$ | 67.1 | 59.8 | 63.3 | 68.9 | 70.15 | 53.97 |
| $Al_2O_3$ | 15.2 | 17.4 | 13.1 | 16 | 15.26 | 17.15 |
| $B_2O_3$ | 0 | 0 | 0 | 0 | 0 | 0.0 |
| MgO | 11.5 | 18.1 | 9.9 | 1.6 | 2.09 | 12.84 |
| CaO | 3.5 | 1.8 | 7.7 | 1.2 | 0 | 3.00 |
| SrO | 0 | 0.3 | 0 | 0 | 0.63 | |
| BaO | 1.1 | 0.2 | 1.7 | 0 | 0 | |
| ZnO | | | | 1.6 | 0.48 | |
| $ZrO_2$ | | | | 0.6 | 0.53 | |
| $Li_2O$ | | | | 8.7 | 9.36 | |
| $Na_2O$ | | | 3.2 | 0.8 | 0.63 | 9.00 |
| $K_2O$ | | | | | | |
| $TiO_2$ | 0.80 | | | | | 4.00 |
| $Y_2O_3$ | | 1.2 | | | | |
| $P_2O_5$ | | 0.7 | 0.5 | 0 | 0 | |
| $SnO_2$ | 0.2 | 0.5 | | 0.2 | 0.3 | 0.02 |
| $CeO_2$ | 0.6 | | 0.6 | 0.4 | 0.57 | 0.00 |
| 合計 | 100.00 | 100.00 | 100.00 | 100.00 | 100.00 | 99.98 |
| $SiO_2 + Al_2O_3$ | 82.30 | 77.20 | 76.40 | 84.90 | 85.41 | 71.12 |
| BaO + SrO | 1.10 | 0.50 | 1.70 | 0.00 | 0.63 | 0.00 |
| MgO + CaO + SrO + BaO | 16.10 | 20.40 | 19.30 | 2.80 | 2.72 | 15.84 |
| $Li_2O + Na_2O + K_2O$ | 0.00 | 0.00 | 3.20 | 9.50 | 9.99 | 9.00 |
| $Li_2O/(Li_2O + Na_2O + K_2O)$ | | | 0.00 | 0.92 | 0.94 | 0.00 |
| $Na_2O/(Li_2O + Na_2O + K_2O)$ | | | 1.00 | 0.08 | 0.06 | 1.00 |
| $SnO_2 + CeO_2$ | 0.80 | 0.50 | 0.60 | 0.60 | 0.87 | 0.02 |
| (MgO + CaO)/ (MgO + CaO + SrO + BaO) | 0.93 | 0.98 | 0.91 | 1.00 | 0.77 | 1.00 |
| MgO/(MgO + CaO + SrO + BaO) | 0.71 | 0.89 | 0.51 | 0.57 | 0.77 | 0.81 |
| Tg (° C.) | 802 | 805 | 738 | 703 | 717 | 690 |
| α (×$10^{-7}$/° C.) | 34.8 | 39.5 | 41.9 | 45.2 | 47.2 | 63.2 |
| Specific gravity | 2.579 | 2.655 | 2.604 | 2.48 | 2.465 | 2.564 |
| Young's modulus (GPa) | 92.6 | 98.2 | 86.4 | 87.9 | 87.5 | 88.1 |
| Specific elastic modulus (MNm/kg) | 35.9 | 37.0 | 33.2 | 35.4 | 35.5 | 34.4 |
| Holding test 1300° C. 16 hr | C | C | B | B | B | A |
| Holding test 1250° C. 16 hr | C | C | C | C | C | C |
| Bubble density rank | A | B | B | A | A | E |

From the results shown in Table 1, it was confirmed that each glass for magnetic recording medium substrate of Examples is excellent in heat resistance and rigidity, has a low specific gravity and a suitable thermal expansion coefficient, and is excellent in glass stability.

A glass, which represents a better evaluation result at a lower temperature in the holding test related to glass stability to be performed according to the above method, is a glass less likely to cause crystals to precipitate in a molten state, and can be molded under lowered molding temperatures. A more lowered temperature can extend lifetimes of constituent members of a molding apparatus, such as an exothermic body, furnace body and pipe. In particular, in a case where a substrate blank is to be produced by press molding, a lower molding temperature is preferable. Moreover, if a molding temperature can be lowered, molding can be performed under an increased glass viscosity, and thus the generation of volatilization, striae and molding bubbles can be suppressed.

On the other hand, a glass for magnetic recording medium substrate of Comparative Example 1 has the composition in Example 9 in Japanese Unexamined Patent Publication (KOKAI) No. 2010-64921 (Patent Literature 1), a glass for magnetic recording medium substrate of Comparative Example 2 has the composition in Example 18 in the same publication, a glass for magnetic recording medium substrate of Comparative Example 3 has the composition in Example 27 in the same publication, a glass for magnetic recording medium substrate of Comparative Example 4 has the composition in Example 29 in the same publication, and a glass for magnetic recording medium substrate of Comparative Example 5 has the composition in Example 30 in the same publication. In the glass for magnetic recording medium substrate of Comparative Example 1, the total content of $SiO_2$ and $Al_2O_3$ is excessive; and in the glasses for magnetic recording medium substrate of Comparative Example 4 and Comparative Example 5, a content of $SiO_2$ and the total content of $SiO_2$ and $Al_2O_3$ are excessive. In the glasses for magnetic recording medium substrate of Comparative Example 4 and Comparative Example 5, the total content of alkali earth oxides is small. In the glasses for magnetic recording medium substrate of Comparative Examples 1 to 3, no alkali metal oxides are contained or the content of alkali metal oxides is small. Each of these glasses for magnetic recording medium substrate of Comparative Examples 1 to 5 had a low thermal expansion coefficient, and in addition, was inferior in glass stability.

Moreover, it was also confirmed that each of glasses in Examples shown in Table 1 had an S-, A- or B-rank in bubble density, and that the generation of bubbles was suppressed.

In contrast, in a glass for magnetic recording medium substrate of Reference Example 1 in which the total content of Sn oxide and Ce oxide was smaller than 0.05 mass %, the generation of bubbles was remarkable (E-rank in bubble density).

[Production of Magnetic Recording Medium Substrate]

(1) Production of Substrate Blank

Next, by a method A or B below, a disk-shaped substrate blank was produced. Furthermore, in the same way, a glass blank for producing a glass spacer for magnetic recording and reproducing apparatus can be obtained.

(Method A)

A clarified and homogenized molten glass of the above Example was flowed out at a constant flow rate from an outflow pipe and was received with a lower die for press molding, and the molten glass having been flowed out was cut with a cutting blade so that a predetermined amount of molten glass lump was able to be obtained on the lower die. Then, the lower die holding the molten glass lump was immediately taken out from the lower position of the pipe and was press-molded into a thin disk having a diameter of 66 mm and a thickness of 1.2 mm, through the use of an upper die facing the lower die and a drum die. The press-molded product was cooled to temperatures not causing the product to change shape, and then it was taken out from the die and annealed to give a substrate blank. In the above molding, plural lower dies were used for molding the molten glass having been flowed out into disk-shaped substrate blanks one after another.

(Method B)

A clarified and homogenized molten glass of the above Example was continuously cast into a heat resistant mold provided with a cylindrical through hole via the through hole, which was then molded into a round column and was taken out from the lower side of the through hole. The taken-out glass was annealed and was then slicing-processed at regular intervals in the direction perpendicular to the round column axis through the use of a multi wire saw to thereby produce disk-shaped substrate blanks.

In this Example, methods A and B were employed, but methods C and D below are also suitable as a method for manufacturing a disk-shaped substrate blank. Furthermore, methods C and D are also suitable as a method for manufacturing a glass blank for producing a glass spacer for magnetic recording and reproducing apparatus.

(Method C)

It is also possible to obtain a substrate blank by: allowing the molten glass of the above Example to flow out onto a float bath; molding the same into a sheet-shaped glass (molding by a float method); subsequently annealing the same; and then boring a disk-shaped glass from the sheet glass.

(Method D)

It is also possible to obtain a substrate blank by: molding the molten glass of the above Example into a sheet-shaped glass by an overflow down-draw method (fusion method); annealing the same; and then boring a disk-shaped glass from the sheet glass.

(2) Production of Glass Substrate

A through hole was bored in the center of the substrate blank obtained by each of the above methods, which was then subjected to grinding processing of outer- and inner-peripheries. Subsequently, the main surface of the disk was subjected to a wrapping process and polishing process (mirror polishing processing) and thereby the disk was finished into a glass substrate for magnetic disk, having a diameter of 65 mm and a thickness of 0.8 mm. Furthermore, in the same way, a glass blank for producing a glass spacer for magnetic recording and reproducing apparatus can be finished into a glass spacer for magnetic recording and reproducing apparatus.

The glass substrate obtained in the above was cleaned through the use of a 1.7 mass % aqueous solution of fluorosilicic acid ($H_2SiF$), subsequently through the use of a 1 mass % aqueous solution of potassium hydroxide, the glass substrate was then rinsed with pure water and dried. In magnification observation of the surface of the substrate produced from the glass in Example, surface roughness and the like were not recognized and the surface was smooth.

[Production of Magnetic Recording Medium (Magnetic Disk)]

Using the following methods, an adhesive layer, an undercoat layer, a magnetic recording layer, a protective layer and a lubricating layer were formed in this order on the main surface of a glass substrate obtained from the glass in Example to thereby give a magnetic disk.

First, through the use of an evacuated film formation apparatus, an adhesive layer, an undercoat layer and a magnetic recording layer were sequentially formed by a DC magnetron sputtering method in an Ar atmosphere.

At this time, the adhesive layer was formed through the use of a CrTi target so as to give an amorphous CrTi layer having a thickness of 20 nm. Subsequently, through the use of a sheet-feeding/stationary facing type film formation apparatus, a layer having a thickness of 10 nm composed of a CrRu as an undercoat layer was formed by a DC magnetron sputtering method in an Ar atmosphere. Furthermore, a magnetic recording layer was formed at 400° C. of a film formation temperature through the use of an FePt or CoPt target so as to give an FePt layer or a CoPt layer having a thickness of 10 nm.

A magnetic disk, in which film formation up to the magnetic recording layer had been finished, was moved from the film formation apparatus into a heating furnace to thereby be subjected to annealing. The temperature in the heating furnace in annealing was set in a range of 650 to 700° C.

Subsequently, a 3 nm protective layer composed of a carbon hydride was formed by a CVD method using ethylene as a material gas. After that, a lubricating layer composed of PFPE (perfluoropolyether) was formed by a dip coating method. The thickness of the lubricating layer was 1 nm.

A magnetic disk was obtained by the above production process. The obtained magnetic disk was mounted on a hard disk drive provided with a DFH mechanism (flying height: 8 nm) and magnetic signals were recorded with a recording density of 20 gigabits per 1 square inch in a recording region on the main surface of the magnetic disk. At this time, a phenomenon (crash failure), in which a magnetic head and a magnetic disk surface collide with each other, was not confirmed.

In an aspect of the present invention, a magnetic recording medium most suitable for higher-density recording can be provided.

Finally, the aforementioned respective aspects are summarized.

In an aspect, provided is a glass for magnetic recording medium substrate, which is an amorphous oxide glass, wherein, in terms of mol %: an $SiO_2$ content ranges from 45 to 68%; an $Al_2O_3$ content ranges from 5 to 20%; a total content of $SiO_2$ and $Al_2O_3$ ($SiO_2+Al_2O_3$) ranges from 60 to 80%; a $B_2O_3$ content ranges from 0 to 5%; an MgO content ranges from 3 to 28%; a CaO content ranges from 0 to 18%; a total content of BaO and SrO (BaO+SrO) of 0 to 2%; a total content of alkali earth metal oxides (MgO+CaO+SrO+BaO) ranges from 12 to 30%; a total content of alkali metal oxides ($Li_2O+Na_2O+K_2O$) ranges from 3.5 to 15%; and at least one kind selected from the group consisting of Sn oxide and Ce oxide being included, a total content of Sn oxide and Ce oxide ranges from 0.05 to 2.00%, a glass transition temperature is equal to or higher than 625° C.; a Young's modulus is equal to or more than 83 GPa; a specific gravity is equal to or less than 2.85; and an average linear expansion coefficient at 100 to 300° C. is equal to or more than $48 \times 10^{-7}/°$ C.

In an aspect, provided is a glass spacer for magnetic recording and reproducing apparatus, the glass spacer being an amorphous oxide glass, wherein, in terms of mol %: an $SiO_2$ content ranges from 45 to 68%; an $Al_2O_3$ content ranges from 5 to 20%; a total content of $SiO_2$ and $Al_2O_3$ ($SiO_2+Al_2O_3$) ranges from 60 to 80%; a $B_2O_3$ content of 0 to 5%; an MgO content ranges from 3 to 28%; a CaO content ranges from 0 to 18%; a total content of BaO and SrO (BaO+SrO) ranges from 0 to 2%; a total content of alkali earth metal oxides (MgO+CaO+SrO+BaO) ranges from 12 to 30%; a total content of alkali metal oxides ($Li_2O+Na_2O+K_2O$) ranges from 3.5 to 15%; and at least one kind selected from the group consisting of Sn oxide and Ce oxide being included, a total content of Sn oxide and Ce oxide ranges from 0.05 to 2.00%, a glass transition temperature is equal to or higher than 625° C.; a Young's modulus is equal to or more than 83 GPa; a specific gravity is equal to or less than 2.85; and an average linear expansion coefficient at 100 to 300° C. is equal to or more than $48 \times 10^{-7}/°$ C.

The above glass for magnetic recording medium substrate is excellent in heat resistance and rigidity, has a low specific gravity and suitable thermal expansion coefficient, and can exhibit excellent glass stability. The same applies to the above glass spacer for magnetic recording and reproducing apparatus.

In an embodiment, in the above oxide glass, the content of $Li_2O$ ranges from 0 to 8 mol %, the content of $Na_2O$ ranges from 0 to 10 mol %, and the content of $K_2O$ ranges from 0 to 5 mol %.

In an embodiment, the above oxide glass contains Sn oxide and Ce oxide.

In an embodiment, in the above oxide glass, a molar ratio of the total content of MgO and CaO relative to the total content of alkali earth metal oxides {(MgO+CaO)/(MgO+CaO+SrO+BaO)} ranges from 0.75 to 1.00.

In an embodiment, in the above oxide glass, a molar ratio of the content of $Li_2O$ relative to the total content of alkali metal oxides {$Li_2O/(Li_2O+Na_2O+K_2O)$} ranges from 0.4 to 1.

In an embodiment, in the above oxide glass, a molar ratio of the content of $Na_2O$ relative to the total content of alkali metal oxides {$Na_2O/(Li_2O+Na_2O+K_2O)$} ranges from 0.4 to 1.

In an embodiment, the content of CaO in the above oxide glass ranges from 2 to 15%.

According to an aspect, a magnetic recording medium substrate comprised of the above magnetic recording medium is provided.

In an embodiment, the above magnetic recording medium substrate is homogeneous in the composition of the surface and inside thereof.

In an embodiment, the above magnetic recording medium substrate has an ion-exchange layer on a part of or on the whole of the surface thereof.

According to an aspect, provided is a magnetic recording medium having a magnetic recording layer on the above magnetic recording medium substrate.

It should be considered that all the embodiments disclosed this time are exemplifications in all respects and are not restrictive ones. It is intended that the scope of the present invention is shown not by the above explanations but by claims, and that all changes in equivalent meanings and ranges to the scope of the claims are included.

For example, by subjecting the glass composition exemplified above to the composition adjustment described in the description, a glass for magnetic recording medium substrate and a glass spacer for magnetic recording and reproducing apparatus according to respective aspects of the present invention can be produced.

Furthermore, it is possible, needless to say, to combine arbitrarily equal to or more than 2 items exemplified or described as preferable ranges in the description.

The invention claimed is:

1. A glass,
which is a glass for magnetic recording medium substrate,
which is an amorphous oxide glass,
wherein the glass has an average linear expansion coefficient α at 100 to 300° C. of equal to or more than $48 \times 10^{-7}/°$ C. and equal to or less than $53.3 \times 10^{-7}/°$ C., and
wherein, in terms of mol %:
an $SiO_2$ content ranges from 52 to 68%;
an $Al_2O_3$ content ranges from 12 to 18%;
a total content of $SiO_2$ and $Al_2O_3$ ($SiO_2+Al_2O_3$) is equal to or less than 80%;
a $B_2O_3$ content ranges from 0 to 5%;
an MgO content ranges from 3 to 28%;
a CaO content ranges from 0 to 18%;
a $TiO_2$ content ranges from 0 to 5%;
a $ZrO_2$ content ranges from 0 to 3%,
a total content of BaO and SrO (BaO+SrO) ranges from 0 to 2%;
a total content of alkali earth metal oxides (MgO+CaO+SrO+BaO) ranges from 12 to 30%;
a molar ratio of a total content of MgO and CaO relative to a total content of alkali earth metal oxides {(MgO+CaO)/(MgO+CaO+SrO+BaO)} ranges from 0.75 to 1.00;
a total content of alkali metal oxides ($Li_2O+Na_2O+K_2O$) ranges from 3.5 to 13%;
a molar ratio of $Li_2O$ content relative to the total content of alkali metal oxides {$Li_2O/(Li_2O+Na_2O+K_2O)$} ranges from 0.4 to 1;
a $Li_2O$ content is equal to or less than 8%;
a $Na_2O$ content is equal to or less than 6%;
a $K_2O$ content is equal to or less than 5%;
a total content of $HfO_2$, $Nb_2O_5$, $Ta_2O_5$, $La_2O_3$ and $Y_2O_3$ ($HfO_2+Nb_2O_5+Ta_2O_5+La_2O_3+Y_2O_3$) ranges from 0 to 5%;
a ZnO content ranges from 0 to 3%; and
a $P_2O_5$ content ranges from 0 to 2%.

2. The glass according to claim 1,
wherein a specific elastic modulus is equal to or more than 31 MNm/kg.

3. The glass according to claim 2,
wherein no crystals are confirmed by magnification observation, magnifying power of 40 to 100, with an optical microscope after the glass is left to stand for 16 hours with a temperature of 1250° C. kept, and then cooled to room temperature.

4. The glass according to claim 3,
wherein a bubble density per unit mass is less than 50/kg, as a density of bubbles each having a diameter exceeding 0.03 mm when observation is performed with an optical microscope at magnifications from 40 to 100.

5. The glass according to claim 2,
wherein a bubble density per unit mass is less than 50/kg, as a density of bubbles each having a diameter exceeding 0.03 mm when observation is performed with an optical microscope at magnifications from 40 to 100.

6. The glass according to claim 1,
wherein no crystals are confirmed by magnification observation, magnifying power of 40 to 100, with an optical microscope after the glass is left to stand for 16 hours with a temperature of 1250° C. kept, and then cooled to room temperature.

7. The glass according to claim 6,
wherein a bubble density per unit mass is less than 50/kg, as a density of bubbles each having a diameter exceeding 0.03 mm when observation is performed with an optical microscope at magnifications from 40 to 100.

8. The glass according to claim 1,
wherein a bubble density per unit mass is less than 50/kg, as a density of bubbles each having a diameter exceeding 0.03 mm when observation is performed with an optical microscope at magnifications from 40 to 100.

9. A magnetic recording medium substrate, which is comprised of the glass according to claim 1.

10. A magnetic recording medium, which comprises a magnetic recording layer on the magnetic recording medium substrate according to claim 9.

11. A magnetic recording and reproducing apparatus, which comprises the magnetic recording medium according to claim 10.

12. The glass according to claim 1, which as a glass transition temperature of equal to or higher than 680° C. and a Young's modulus of equal to or more than 90 GPa.

13. A glass,
which is a glass for magnetic recording medium substrate, which is an amorphous oxide glass,
wherein the glass has a glass transition temperature of equal to or higher than 680° C. and a Young's modulus of equal to or more than 90 GPa, and
wherein, in terms of mol %:
an $SiO_2$ content ranges from 52 to 68%;
an $Al_2O_3$ content ranges from 12 to 18%;
a total content of $SiO_2$ and $Al_2O_3$ ($SiO_2+Al_2O_3$) is equal to or less than 80%;
a $B_2O_3$ content ranges from 0 to 5%;
an MgO content ranges from 3 to 28%;
a CaO content ranges from 0 to 18%;
a $TiO_2$ content ranges from 0 to 5%;
a $ZrO_2$ content ranges from 0 to 3%,
a total content of BaO and SrO (BaO+SrO) ranges from 0 to 2%;
a total content of alkali earth metal oxides (MgO+CaO+SrO+BaO) ranges from 12 to 30%;
a molar ratio of a total content of MgO and CaO relative to a total content of alkali earth metal oxides {(MgO+CaO)/(MgO+CaO+SrO+BaO)} ranges from 0.75 to 1.00;
a total content of alkali metal oxides ($Li_2O+Na_2O+K_2O$) ranges from 3.5 to 13%;
a molar ratio of $Li_2O$ content relative to the total content of alkali metal oxides {$Li_2O/(Li_2O+Na_2O+K_2O)$} ranges from 0.4 to 1;
a $Li_2O$ content is equal to or less than 8%;
a $Na_2O$ content is equal to or less than 6%;
a $K_2O$ content is equal to or less than 5%;
a total content of $HfO_2$, $Nb_2O_5$, $Ta_2O_5$, $La_2O_3$ and $Y_2O_3$ ($HfO_2+Nb_2O_5+Ta_2O_5+La_2O_3+Y_2O_3$) ranges from 0 to 5%;
a ZnO content ranges from 0 to 3%; and
a $P_2O_5$ content ranges from 0 to 2%.

14. The glass according to claim 13,
wherein a specific elastic modulus is equal to or more than 31 MNm/kg.

15. The glass according to claim 13,
wherein no crystals are confirmed by magnification observation, magnifying power of 40 to 100, with an optical microscope after the glass is left to stand for 16 hours with a temperature of 1250° C. kept, and then cooled to room temperature.

16. The glass according to claim 13,
wherein a bubble density per unit mass is less than 50/kg, as a density of bubbles each having a diameter exceeding 0.03 mm when observation is performed with an optical microscope at magnifications from 40 to 100.

17. A magnetic recording medium substrate, which is comprised of the glass according to claim 13.

18. A magnetic recording medium, which comprises a magnetic recording layer on the magnetic recording medium substrate according to claim 17.

19. A magnetic recording and reproducing apparatus, which comprises the magnetic recording medium according to claim 18.

* * * * *